United States Patent [19]
Kucherov

[11] Patent Number: 5,644,184
[45] Date of Patent: Jul. 1, 1997

[54] PIEZO-PYROELECTRIC ENERGY CONVERTER AND METHOD

[75] Inventor: Yan R. Kucherov, Salt Lake City, Utah

[73] Assignee: Thermodyne, Inc., Salt Lake City, Utah

[21] Appl. No.: 602,159

[22] Filed: Feb. 15, 1996

[51] Int. Cl.$^6$ .................................................. H02N 3/00
[52] U.S. Cl. ........................ 310/306; 310/308; 322/2 R
[58] Field of Search ................................. 310/306, 308; 322/2 R

[56] References Cited

U.S. PATENT DOCUMENTS

| | | | |
|---|---|---|---|
| 3,073,974 | 1/1963 | Hoh | 307/149 |
| 3,243,687 | 3/1966 | Hoh | 322/2 |
| 3,610,970 | 10/1971 | Skinner | 310/10 |
| 3,912,830 | 10/1975 | Murayama et al. | 427/100 |
| 4,058,729 | 11/1977 | Sher | 250/370 |
| 4,084,101 | 4/1978 | Sher | 290/1 R |
| 4,096,393 | 6/1978 | Sher | 290/1 R |
| 4,213,797 | 7/1980 | Sher | 136/89 SP |
| 4,220,906 | 9/1980 | Drummond | 322/2 A |
| 4,365,106 | 12/1982 | Pulvari | 136/206 |
| 4,425,540 | 1/1984 | Olsen | 322/2 |
| 4,620,262 | 10/1986 | Olsen | 361/323 |
| 4,647,836 | 3/1987 | Olsen | 322/2 |
| 4,877,988 | 10/1989 | McGinniss et al. | 310/306 |
| 5,065,085 | 11/1991 | Aspden et al. | 322/2 |
| 5,288,336 | 2/1994 | Strachan et al. | 136/200 |
| 5,376,184 | 12/1994 | Aspden | 136/203 |
| 5,438,553 | 8/1995 | Wilson et al. | 367/140 |

FOREIGN PATENT DOCUMENTS

| | | | |
|---|---|---|---|
| 2283361 | 5/1995 | United Kingdom | G01L 35/32 |

OTHER PUBLICATIONS

Aoyagi, M. et al., "High Torque Ultrasonic Motor Using Longitudinal and Torsional Vibrations" *ISAF '94 Proceedings of the Ninth IEEE International Symposium on Applications of Ferroelectrics*, (1994) pp. 541–544.

Blochwitz, S. et al., "Nonlinear Dynamics and Ferroelectric Materials" *ISAF '94 Proceedings of the Ninth IEEE Interantional Symposium on Applications of Ferroelectrics*, (1994) pp. 709–712.

Bloomfield, P.E. et al., "The Design, Processing, Evaluation and Characterization of Pyroelectric PVDF Copolymer/Silicon Mosfet Detector Arrays" *ISAF '94 Proceedings of the Ninth IEEE International Symposium on Applications of Ferroelectrics*, (1994) pp. 725–728.

Choi, S.W. et al., "Dielectric, Piezoelectric, and Pyroelectric Properties of Barium–Modified Lead Magnesium Tantalate–Lead Titanate Ceramics" *ISAF '94 Proceedings of the Ninth IEEE International Symposium on Applications of Ferroelectrics*, (1994) pp. 806–807.

Dausch, D.E., et al. "Antiferroelectric/Ferroelectric Composite Thin Films" *ISAF '94 Procedings of the Ninth IEEE Internatioanl Symposium on Applications of Ferroelectrics*, (1994) pp. 701–704.

Golestaneh, A.A., "Study of Thermoelectric Conversion Using Some Ferroelectric Material" *Ferroelectrics*, (1981) vol. 38, p. 984.

Jin, B.M. et al., "Pyroelectric Measurements on Various Kinds Doped TGS Single Crystals" *ISAF '94 Proceedings of the Ninth IEEE International Symposium on Applications of Ferroelectrics*, (1994) pp. 825–828.

(List continued on next page.)

*Primary Examiner*—Clayton E. LaBalle
*Attorney, Agent, or Firm*—Paul S. Evans

[57] ABSTRACT

The present invention embodies a piezo-pyroelectric energy converter and is directed to a method and apparatus for conversion of thermal energy to electrical energy and refrigeration. The present invention utilizes one or more piezo-pyroelectric materials with thermally conductive metal electrodes, which resonate at a high frequency and are in thermal communication with hot and cold heat sinks to create a thermal gradient and heat flow along the metal electrodes and the piezo-pyroelectric material.

86 Claims, 17 Drawing Sheets

OTHER PUBLICATIONS

Jung, J.M. et al., "Dielectric, Piezoelectric, and Pyroelectric Properties of Sr–doped PMT–PT Solid Solutions Ceramics" *ISAF '94 Proceedings of the Ninth IEEE International Symposium on Applications of Ferroelectrics*, (1994) pp. 810–811.

Kewitsch, A.S. et al., "Optically Induced Ferroelectric Domain Gratings in SBN: Theory and Applications to Quasi–Phase Matching and Optical Data Storage" *ISAF '94 Proceedings of the Ninth IEEE International Symposium on Applications of Ferroelectrics*, (1994) pp. 719–724.

Khutorsky, V.E. et al., "Pyroelectric and Dielectric Properties of Dry and Moist TGS–Gelatin Films" *ISAF '94 Proceedings of the Ninth IEEE International Symposium on Applications of Ferroelectrics*, (1994) pp. 817–820.

Li, Longtu et al., "Study on Characteristics of Standing Wave Motors" *ISAF '94 Proceedings of the Ninth IEEE International Symposium on Applications of Ferroelectrics*, (1994) pp. 713–716.

Liu, R.B. et al., "Series Pyroelectric Ceramics Used for Small Area IR Detector" *ISAF '94 Proceedings of the Ninth IEEE International Symposium on Applications of Ferroelectrics*, (1994) pp. 812–814.

Liu, R.B. et al., "Pyroelectric Ceramics With Low Resistivity" *ISAF '94 Proceedings of the Ninth IEEE International Symposium on Applications of Ferroelectrics*, (1994) pp. 815–816.

Newnham, R.E. et al., "Composite Transducers and Actuators" *ISAF '94 Proceedings of the Ninth IEEE International Symposium on Applications of Ferroelectrics*, (1994) pp. 705–708.

Olsen, R.B. et al., "A Pyroelectric Energy Converter Which Employs Regeneration" *Ferroelectrics*, (1981) vol. 13, pp. 975–978.

Patel, A. et al., "Ferroelectric Ceramics and Thin Films for Uncooled Thermal Imaging Arrays" *ISAF '94 Proceedings of the Ninth IEEE International Symposium on Applications of Ferroelectrics*, (1995) pp. 647–652.

Sinyavsky, Y.V. et al., "The Optical Ferroelectric Ceramic As Working Body for Electrocaloric Refrigeration" in *Ferroelectrics* (1989) vol. 90, pp. 213–217.

Vohra, S.T. et al., "Mixing and Detection of Electrical Signals from 10 Hz to 20 Ghz in a Electrostrictive Fiber Optic Sensor" *ISAF '94 Proceedings of the Ninth IEEE International Symposium on Applications of Ferroelectrics*, (1994) pp. 717–718.

Weon, H.Y. et al., "Dielectric, Piezoelectric and Pyroelectric Properties of the $Pb(Mg_{1/3}Ta_{2/3})O_3$–$PbTiO_3$–$PbZrO_3$ Solid Solution System" *ISAF '94 Proceedings of the Ninth IEEE International Symposium on Applications of Ferroelectrics*, (1994) pp. 808–809.

Yongling, W. et al., "The Applications of PZT95/Ceramics by Induced Phase Transformation" in *1990 IEEE 7th International Symposium on Applications of Ferroelectrics*, pp. 513–516.

Zhang S.R. et al., "Fabrication of Pyroelectric Thin Film Ceramics by Tape Casting Method" *ISAF '94 Proceedings of the Ninth IEEE International Symposium on Applications of Ferroelectrics*, (1994) pp. 804–805.

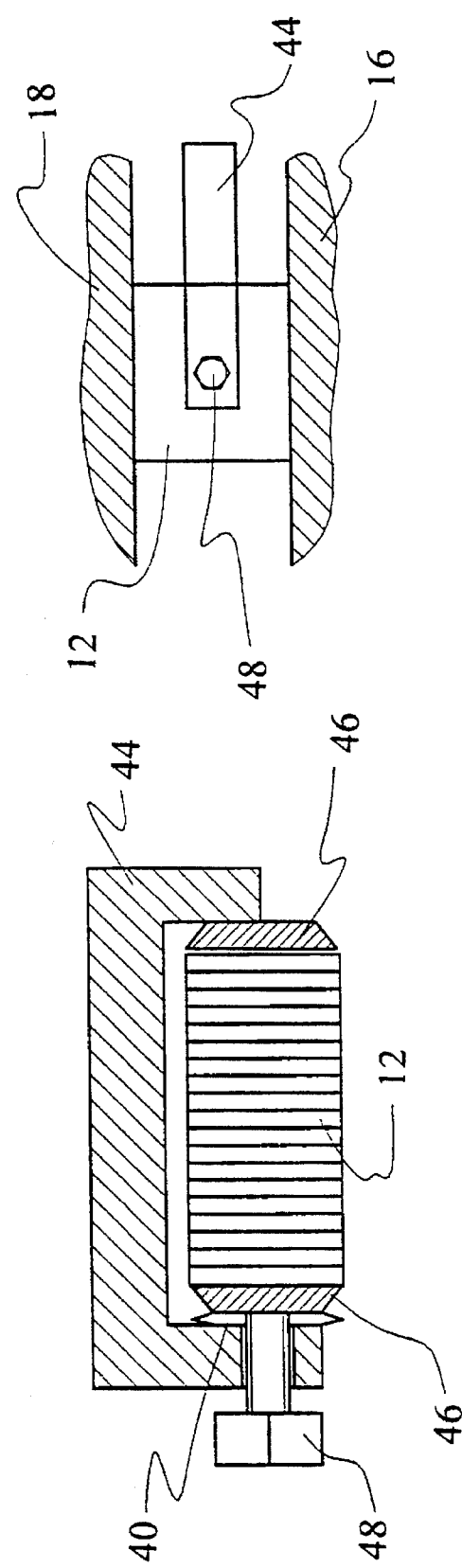

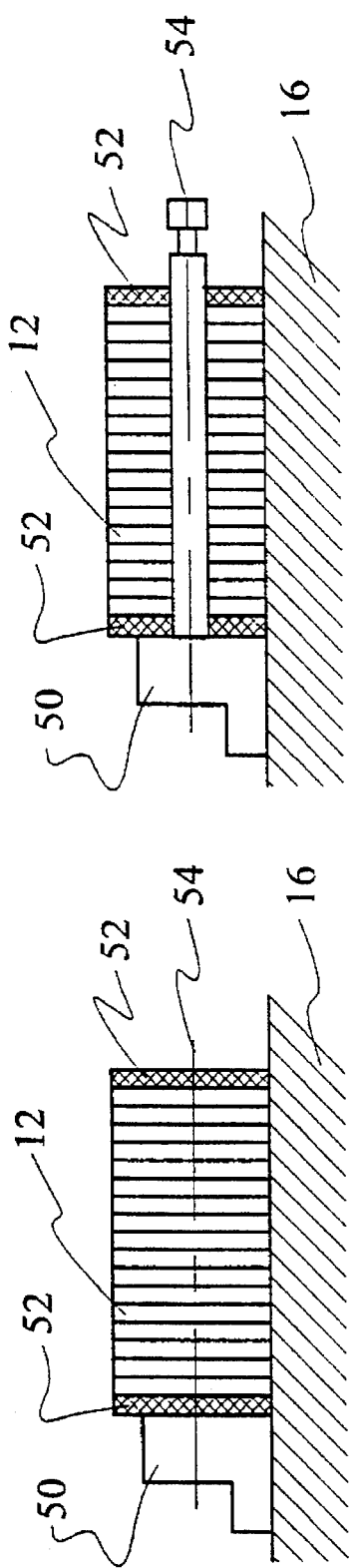
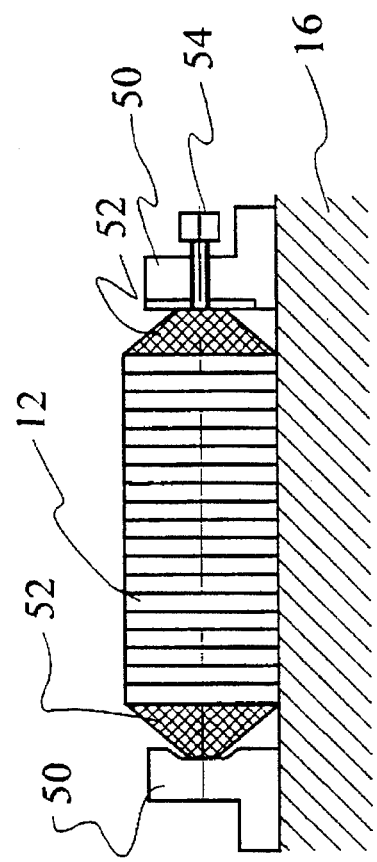
FIGURE 12a
FIGURE 12b
FIGURE 12c

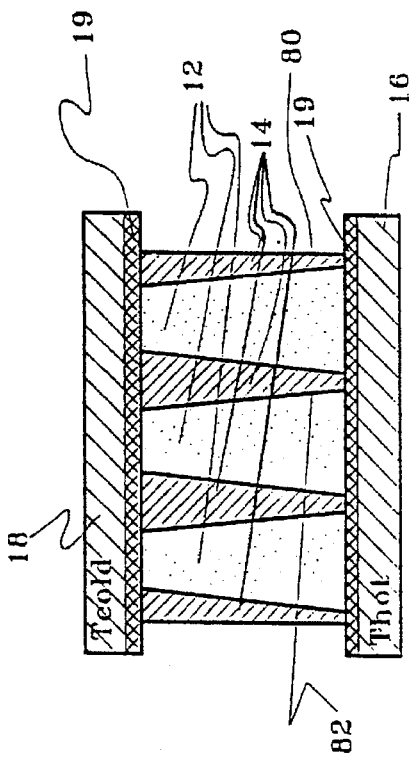
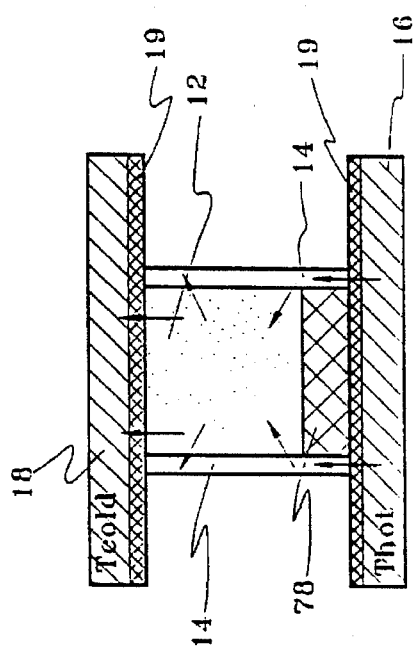
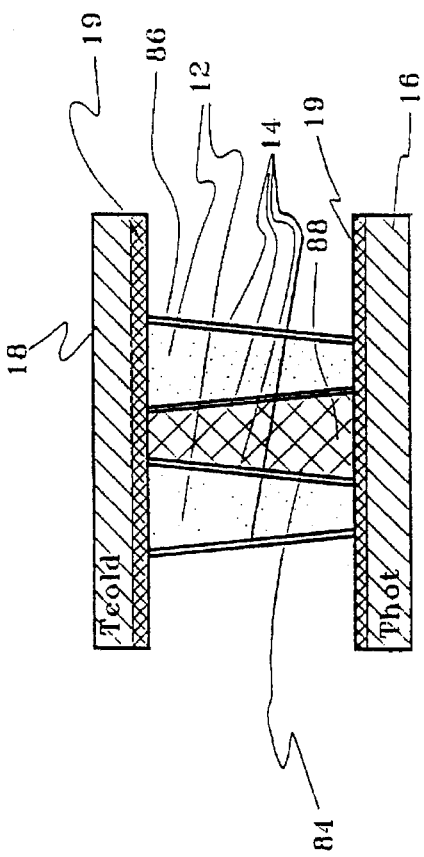
FIGURE 23
FIGURE 24
FIGURE 25

PIEZO-PYROELECTRIC ENERGY CONVERTER AND METHOD

FIELD OF THE INVENTION

This invention relates to methods and apparatus for piezo-pyroelectric energy conversion, and more particularly to such methods and apparatus which utilize the direct conversion of thermal energy to electrical energy using an electrocaloric effect in pyroelectric materials by the use of one or more capacitors in compression and having temperature dependent pyroelectric properties, the capacitors being in thermal communication with metal contacts for increasing the converted portion of the heat flow propagating from the hot to cold heat sink and a means for resonating the capacitor at the operating frequency.

BACKGROUND OF THE INVENTION

The present invention was developed to fill a need for a device which efficiently converts thermal energy to electrical energy with power densities large enough for practical applications.

Current pyroelectric power converters include stacked capacitors having temperature dependent capacitance and the use of reeds which serve as thermal switches and are caused to vibrate by the flow of vapor carrying heat between stages, thereby pulsing the heat at the proper frequency and phase through the stacked capacitors. Another known device exploits a somewhat different concept in an energy conversion system in which a first material within the region between the electrodes of a capacitor is replaced, following charging of the capacitor, by a second material having a lower dielectric constant than the first material. The capacitor is then discharged and the first material is restored to the region between the capacitor electrodes for subsequent recharging.

Another approach uses a material with a dielectric constant different from that of a vacuum which is inserted between capacitor electrodes. In this case, mechanical work is performed against an electric field and the device is essentially the same as an electromagnetic motor. This approach is different from using pyroelectric materials and electrocaloric effect, because it uses capacitance change at a constant charge. In the case of pyroelectric action, the charge is changing according to the temperature change. If the relative dielectric constant is also changing with temperature, it is a side effect.

A further approach uses electrocaloric effect for pyroelectric conversion of heat into electricity. However, this approach has a large time constant because the pyroelectric material is mechanically moved from the hot to cold zone. With respect to devices deriving electrical energy by thermally cycling capacitors with temperature dependent properties, the small efficiencies and low power densities have apparently precluded their use in any practical application for the production of electrical energy.

There remains a need to provide a more satisfactory solution to converting thermal energy to electrical energy.

SUMMARY OF THE INVENTION

The present invention seeks to resolve a number of the problems which have been experienced in the background art, as identified above. More specifically, the apparatus and method of this invention constitute an important advance in the art of pyroelectric power conversion, as evidenced by the following objects and advantages realized by the invention over the background art.

One object of the present invention is to combine pyroelectric and piezoelectric effects.

A further object of the present invention is to enhance operating efficiency by resonating high frequency oscillations from a piezoelectric effect.

Additionally, it is an object of the present invention to enhance the pyroelectric effect while decreasing the thermal inertia of the system by placing a metal contact in thermal communication with a pyroelectric material during piezoelectric oscillations. A metal next to the pyroelectric material brings down dramatically the time constant of heat replenishment, which enhances the harvesting of the charge created.

Yet another object of the present invention is to increase performance by matching the thermal inertia of the device with the piezoelectric oscillations.

Additional objects and advantages of the invention will be apparent from the description which follows, or may be learned by the practice of the invention.

Briefly summarized, the foregoing objects are achieved by an apparatus which comprises one or more piezo-pyroelectric material plates with thermally conductive metal electrodes which resonate at high frequency and are in thermal communication with hot and cold heat sinks to create a thermal gradient and thus heat flow along the metal electrodes and across the pyroelectric material. The piezo-electric resonance causes small alternating temperature rises and drops due to pyroelectric action. By removing the pyroelectric charge of one sign with an external electrical circuit, asymmetric heat flow is created from the metal electrodes to the piezo-pyroelectric material. This asymmetric heat flow is converted into electrical energy. The resonance brings down the dissipation losses in the piezo-pyroelectric material. This type of converter can be utilized with most materials showing both pyroelectric and piezoelectric properties at varying efficiencies.

BRIEF DESCRIPTION OF DRAWINGS

In order to more fully understand the manner in which the above-recited advantages and objects of the invention are obtained, a more particular description of the invention will be rendered by reference to specific embodiments thereof which are illustrated in the appended drawings. Understanding that these drawings depict only typical embodiments of the invention and are therefore not to be considered limiting of its scope, the presently preferred embodiments and the presently understood best mode of the invention will be described with additional detail through use of the accompanying drawings in which:

FIG. 11a is a pyroelectric material stack having an integrated compressing frame.

FIG. 11b is a top view of FIG. 11a.

FIGS. 12a through 12c are pyroelectric converters having an integrated heat sink and compressing frame.

FIG. 23 is a cross-section view of another embodiment of a pyroelectric converter.

FIG. 24 is a cross-section view of another embodiment of a pyroelectric converter.

FIG. 25 is a cross-section view of another embodiment of a pyroelectric converter.

DETAILED DESCRIPTION OF THE INVENTION

Figure 1:
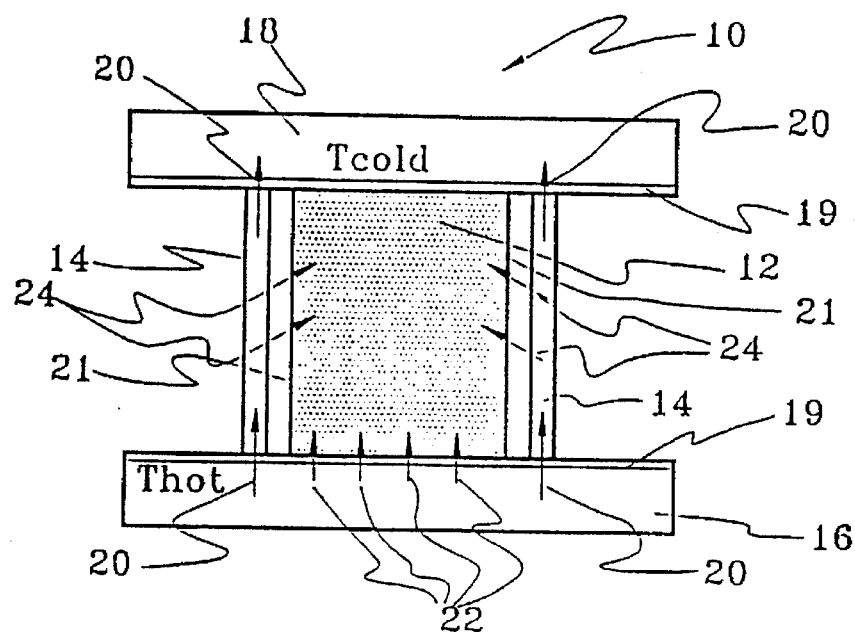
FIG. 1 is a cross-section view of a pyroelectric converter incorporating teachings of the present invention without the electronics portion.

The present invention embodies a piezo-pyroelectric converter 10 and is directed to a method and apparatus for conversion of energy generally illustrated in FIG. 1. The present invention utilizes one or more piezo-pyroelectric materials 12 with thermally conductive metal electrodes 14, which resonate at a high frequency and are in thermal communication with a hot heat sink 16 and a cold heat sink 18 to create a thermal gradient and heat flow along the metal electrodes and the piezo-pyroelectric material 12. The hot heat sink 16 and cold heat sink 18 are defined as two thermally conductive materials. Converter 10 operates as a thermal energy to electrical energy converter when the initial temperature differential of the hot and cold heat sinks is greater than zero and a voltage is applied. The converter 10 operates as a heat pump/refrigerator when the initial temperature of the hot and cold heat sinks are equal and a voltage is applied.

The piezoelectric resonance causes small alternating temperature rises and drops across the pyroelectric due to pyroelectric action. By removing the pyroelectric charge of one sign with an external electrical circuit for charge removal, such as a resistive load with a threshold voltage switch or thyristor based switch, asymmetric heat flow is created from the metal electrodes 14 to the piezo-pyroelectric material 12. Charge removal leads to a voltage difference and asymmetric temperatures in the positive and negative cycles which is converted into electricity. Resonating the material 12 at its acoustical resonance frequency allows the dissipation losses in the material 12 to be lowered. This type of converter can be utilized with materials showing both pyroelectric and piezoelectric properties at varying efficiencies.

1. Principle of Operation

The invention operates on an electrocaloric effect, resulting in a change of pyroelectric temperature caused by a change in the electric field (see, Born, M. "On the Quantum Theory of Pyroelectricity" *Reviews of Modern Physics*, Volume 17, Nos. 2 and 3, (April–July, 1945), pp. 245–251).

The change in element volume of crystal energy is governed by the equation dU=TdS+EdP (see Lang, S. B. *Sourcebook of Pyroelectricity*, New York, Gordon and Breach, Science Publishers, Inc., 1974, pp. 1–10, the contents of which are specifically incorporated herein), where T is the temperature, S is the entropy, E is the electric field, and P is the pressure. From here:

$$d(u - EP) = TdS - PdE, \text{ or } \left(\frac{\partial T}{\partial E}\right)S = -\left(\frac{\partial P}{\partial S}\right)E.$$

The electrocaloric coefficient follows the equation:

$$q = \frac{\partial T}{\partial E} = -\frac{pT}{\rho C}, \text{ where } p = \frac{\partial P^o}{\partial T}$$

is the pyroelectric constant, $\rho$ is the density, C is the specific heat capacity, and T is the absolute temperature. From these relationships, the change in temperature is:

$$\Delta T = k\frac{TE}{\rho C} p. \tag{1}$$

This equation defines the sample temperature change when the electric field E is changed. The additional "pyroelectric quality coefficient" k is introduced in comparison to the electromechanical coefficient for piezoelectric with values from 0.1 to 0.9 and describes dissipation losses in the material. For a Pb (Zr, Sn, Ti)$O_3$ system (PZST—lead zirconate stannate titanate), the pyroelectric quality coefficient is approximately 0.1 (see, Tuttle, B. A. and Payne, D. A. "The Effects of Microstructure on the Electrocaloric Properties of Pb(Zr,Sn,Ti)$O_3$ Ceramics" *Ferroelectrics*, Vol. 37 (1981) pp. 603–606). Tuttle also indicates maximum values of $\Delta T$=2.6 K. for PZST.

Whereas pyroelectric and piezoelectric properties are defined by site displacement in a crystalline lattice, it is reasonable to assume that these effects will be similar down to a single atomic layer of about four angstroms for most crystalline pyroelectric materials. Organic pyroelectrics which do not have crystalline structure will be addressed hereafter. If AC voltage is applied to a capacitor comprising a planar geometry pyroelectric with metal electrodes on both sides, its temperature will change in a sine form relative to the initial temperature according to equation (1), with the AC frequency. Pyroelectrics are known for their low thermal conductivity of about 1–20 W/m·K.). If a metal, having a high thermal conductivity of about 50–450 W/m·K.), is on the surface of the pyroelectric, heat will flow from the metal to the pyroelectric during the cold cycle and from the pyroelectric to the metal during the hot cycle. If energy, defined by equations (6.1) and (6.2) set forth hereafter, is extracted during the cycle, the heat flow will be asymmetric and allow conversion of thermal energy to electric energy.

The limiting factor may be the thermal inertia of the system. The temperature change rate can be estimated from a non-stationary thermal conductivity equation. In a planar geometry, a one dimensional approach is sufficient, as follows:

$$\frac{\partial T}{\partial \tau} = \frac{1}{C\rho} \frac{\partial q_x}{\partial x}, \qquad (2)$$

where $q_x$ is the heat flow along the x-axis, C is the heat capacity, and $\eta$ is the density of the pyroelectric material. Here $q_x = -\lambda \partial T/\partial x$, where $\lambda$ is the thermal conductivity. From symmetry considerations on the plate median $q_x$ and $\partial T/\partial x = 0$, since two equal heat flows from the two metal electrodes compensate for each other. This implies that the heat flow is changing from a certain value on the plate surface to zero on the median. It is assumed that $\lambda_{metal} \gg \lambda_{pyroelectric}$, and rate limitations come from the pyroelectric material.

In the present invention, $\partial T/\partial x$ equals $\Delta T$ in equation (1), divided by the lattice parameter, giving the gradient value of $3 \times 10^8$ K/m for $\Delta T=0.1$ ° K. and PZT-5A (lead zirconate-titanate) as a pyroelectric. Even for the worst case scenario, when the heat flow changes linearly from a maximum value on the surface to zero on the plate median, the temperature change rate is approximately $10^5 – 10^7$ K./s with a time constant $$\tau_k = \Delta T / \left( \frac{\partial T}{\partial \tau} \right) = 10^{-6} - 10^{-8} s.$$

Therefore, the thermal inertia is not a limiting factor for frequencies up to a megahertz. From the same considerations, pyroelectrics with good thermal conductivities of about 10–20 W/(m·K.), such as, LiTaO₃, have a time constant of about $3 \times 10^8$ s. For these materials, the specific converter power may be improved, in principle, by incorporating higher frequencies. By comparison, at a temperature difference of 100 K. along the Y-axis, the time constant for a 1 cm long PZT-5A plate $\tau_y$, equals 0.5 s. The conversion condition is: $W_x \tau_x > W_y \tau_y$, where $W_x$ is the heat flow due to pyroelectric conversion and $W_y$ is the heat flow through the metal electrode due to the temperature gradient.

Attention is now drawn to FIG. 1 where the pyroelectric material 12 acts as a capacitor in thermal contact between hot heat sink 16 and cold heat sink 18 in a manner wherein the thermal gradient is along its plane indicated by arrows 20. If the heat flow from metal electrodes 14 to pyroelectric material 12 is replenished by thermal gradient 20 from hot heat sink 16 to cold heat sink 18 at the rate defined by the conversion power, the conversion efficiency will be defined by coefficient k multiplied by the ideal Carnot cycle efficiency. The k values can be as high as 0.78 for piezo-pyroelectric material PZT-5A. Heat flowing (designated by arrows 22) directly from hot heat sink 16 to cold heat sink 18 through piezo-pyroelectric material 12 is lost. Also, losses in the electrical circuit bring down the overall efficiency of the converter 10.

A different condition exists with organic pyroelectrics not having a crystalline structure. The pyroelectric effect in these materials is probably due to temperature induced molecular tilt (see, Colbrook, R. et al., "Pyroelectric Organo-Metallic Langmuir-Blodgett Films" *Ferroelectrics*, Vol. 92 (1989), p. 381–386). If this is the case, the rate is defined by the specific molecular oscillation frequency, which is about $10^8 – 10^9$ Hz. This condition is also accompanied by lower values of dielectric constant (electric capacitance), thereby allowing higher operating frequencies. Although the pyroelectric properties of organic compounds are poor in comparison to ceramics, an efficient converter is feasible because of the higher possible operating frequencies.

Figure 13:
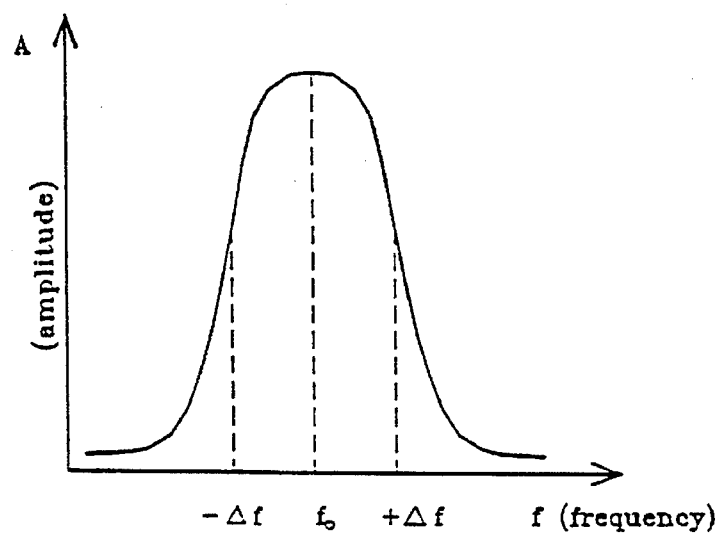
FIG. 13 is a graph of the resonant frequency $f_o$.

The driving AC frequency of the converter 10 is defined by an external electrical circuit discussed hereafter. The losses associated with this drive may be high, depending on the dielectric losses tangent (typically 0.001–0.1), the material mechanical quality constant Q (10–10⁵), and the design of converter 10. If the converter 10 is in acoustic resonance at the driving frequency, all of the losses can be diminished by a factor of 100 or more. Hence, the driving frequency must be close to the main harmonic of the stack resonance $\omega_o$, according to FIG. 13. For organic pyroelectrics, the driving frequency should be close to the higher resonance harmonics $n \cdot \omega_o$ of the converter 10.

Assuming that the driving voltage from the external electrical circuit is a sine wave, the voltage is as follows:

$$V(t) = V_o \sin(\omega t)$$

The following illustrates the pyroelectric action of a LiTaO₃ single crystal plate having an area of $1 \times 1$ cm² and a thickness of 100 microns. This material has a pyroelectric constant of 230 μC/(Km²), a relative dielectric constant of about 50, a thermal conductivity of about 20 W/(mK), a density of about $4.6 \times 10^3$ kg/m³, and a heat capacity about 500 J/(kg K.). Assuming that k=0.5 in equation (1), the operating AC voltage amplitude is $V_o=50$ V, and the operating temperature is 700 K. The capacitance of the capacitor is:

$$C_o = \frac{\epsilon \epsilon_o \sigma}{d},$$

where $\epsilon$ is the relative dielectric constant, $\epsilon_o$ is the dielectric constant of vacuum ($8.854 \times 10^{-12}$ F/m), $\sigma$ is the plate area, and d is the plate thickness. In this instance, the plate capacitance is $4.16 \times 10^{-10}$ F.

Using equation (1), the temperature drop in one cycle is 0.017° K. (precision is defined by calculations, i.e. $\delta = 10^{-6}$). The pyroelectric voltage change associated with this temperature change is:

$$V_p = p \sigma \Delta T / C_o, \qquad (3),$$

where p is the pyroelectric coefficient. Substituting the variables, the equation becomes:

$$V_p(t) = \frac{kTp^2}{\epsilon \epsilon_o \rho C} V(t) = \alpha V_o \sin(\omega t), \qquad (4)$$

where k is the material quality constant, T is the absolute temperature, p is the pyroelectric coefficient, $\epsilon$ is the relative dielectric constant, $\epsilon_o$ is the vacuum dielectric constant, $\eta$ is the density, and C is the heat capacity.

Figure 2:
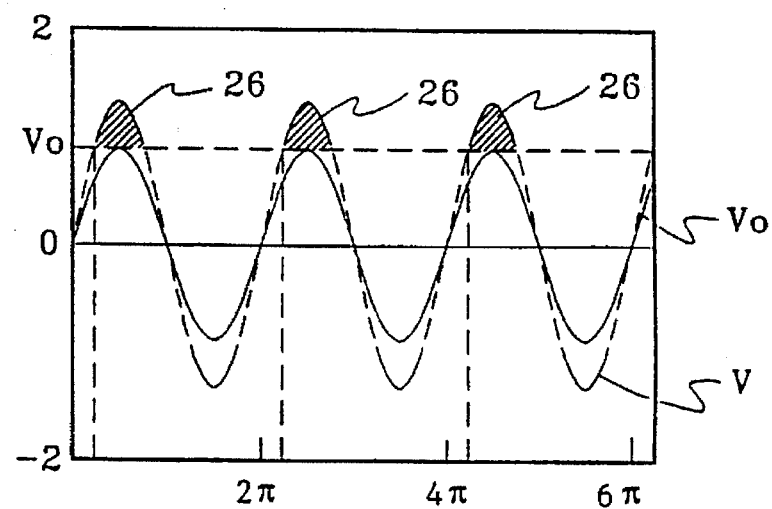
FIG. 2 is a voltage versus time plot for an electrical circuit powering the present invention.
Figure 3:
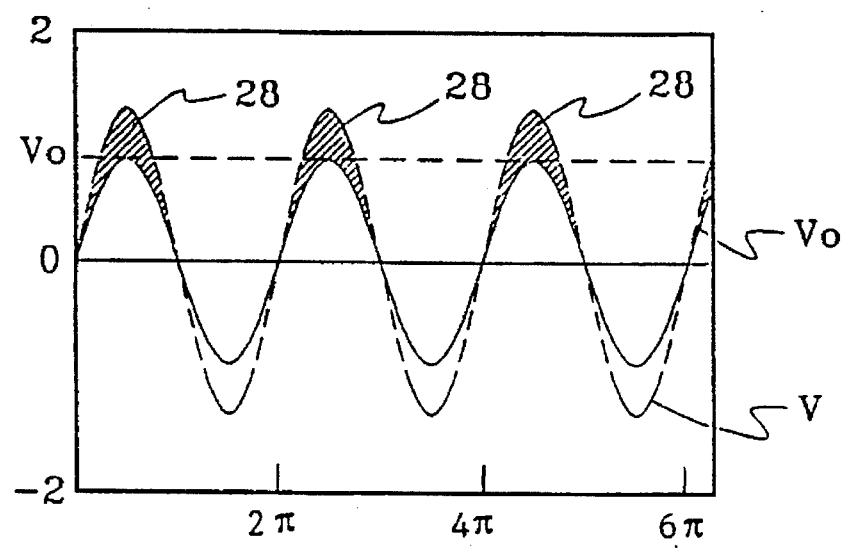
FIG. 3 is a voltage versus time plot for an electrical circuit powering the present invention.

In our case $V_p$ is 0.97 V, or a 2% change over driving voltage $V_o$, or 4% over the energy in a driving cycle. This situation is illustrated in FIGS. 2 and 3. The solid sine line is the driving voltage $V_o$ and the dashed line V is the sum of the driving voltage $V_o$ and the pyroelectric voltage $V_p$, where $V(t) = V_o(t) + V_p(t)$.

With a voltage sensitive electrical circuit, the dashed area 26 illustrated in FIG. 2 can be directed to the useful load and compensate for the driving losses. The circuit can be self sustaining if initiated with an external pulse generator, such as a Hewlett Packard pulse/function generator model 8116A or sine wave generator, through piezoelectric action, as long as the integral energy losses are less than 4% per cycle. For LiTaO$_3$ single crystal losses are extremely low due to low values of tan δ ($10^{-4}$ to $10^{-3}$) and high Q$_m$ ($10^5$). In resonance, energy losses are less than 0.01% per cycle, which are negligible. For polycrystalline materials the losses are higher, but in a reasonable region, e.g., 0.5% for PZT-5A, and can be easily compensated for with pyroelectric action. For materials with high pyroelectric coefficients, e.g., PZST, V$_p$ may be comparable with the driving voltage.

Two examples of power managing electronic circuits are:
1. Amplitude sensitive (FIG. 2).
2. Phase and amplitude sensitive (FIG. 3).

The circuit for the voltages illustrated in FIG. 3 allows more power to be extracted from the same converter 10, than for the circuit for the voltages illustrated in FIG. 2. The energy stored in the capacitor plate at the driving voltage follows the equation:

$$W_1(t) = \frac{C_o}{2} V_o^2 \sin^2(\omega t).$$

The energy stored in the capacitor plate at the driving voltage plus the pyroelectric voltage follows the equation:

$$W_2(t) = \frac{C_o}{2} V_o^2 (1 + \alpha)^2 \sin^2(\omega t).$$

The difference between these two energies, corresponding to FIG. 3 (phase and amplitude sensitive power harvesting electrical circuit) are as follows:

$$\Delta W(t) = \frac{C_o}{2} V_o^2 (2\alpha + \alpha^2) \sin^2(\omega t). \quad (5)$$

For one cycle shown in FIG. 3, the converted electrical energy will be:

$$\Delta W_{cycle} = C_o (V_o)^2 (2\alpha + \alpha^2) \int_0^{\frac{\pi}{2}} \sin^2(\omega t)\, d(\omega t). \quad (6.1)$$

For one cycle shown in FIG. 2, the converted electrical energy will be:

$$\Delta W_{cycle} = C_o(V_o)^2 \left[ (1+\alpha)^2 \int_{\arcsin\left(\frac{V_o}{V_o+V_p}\right)}^{\frac{\pi}{2}} \sin^2(x)\, dx - \int_{\arcsin\left(\frac{V_o}{V_o+V_p}\right)}^{\frac{\pi}{2}} dx \right]. \quad (6.2)$$

If V$_o$>>V$_p$, the lower integration limit in (6.2) may be replaced for arcsin (1−α).

The specific converting power per square centimeter of the hot heat sink for a stack of plates having a width of one centimeter will be:

$$W = \Delta W_{cycle} \omega N, \quad (7)$$

where ω is the driving frequency and N is the number of plates per centimeter of the stack.

Figure 4:
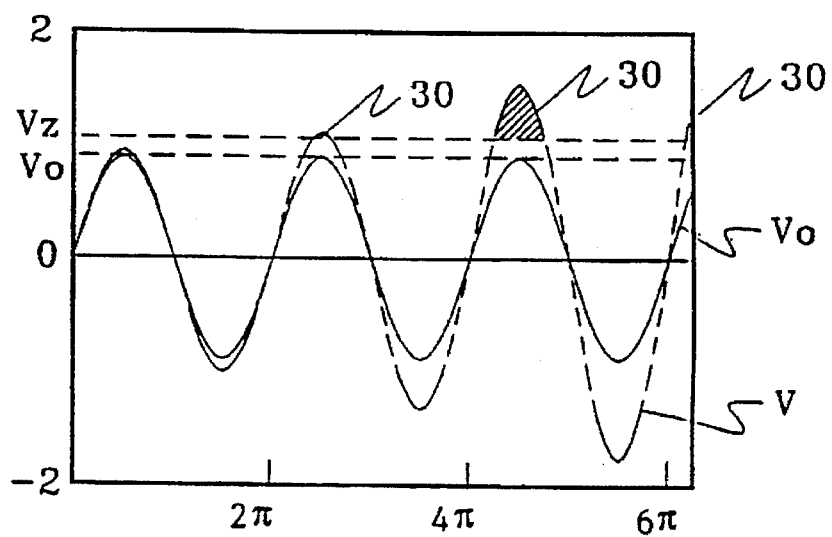
FIG. 4 is a voltage versus time plot for an electrical circuit powering the present invention.
Figure 21:
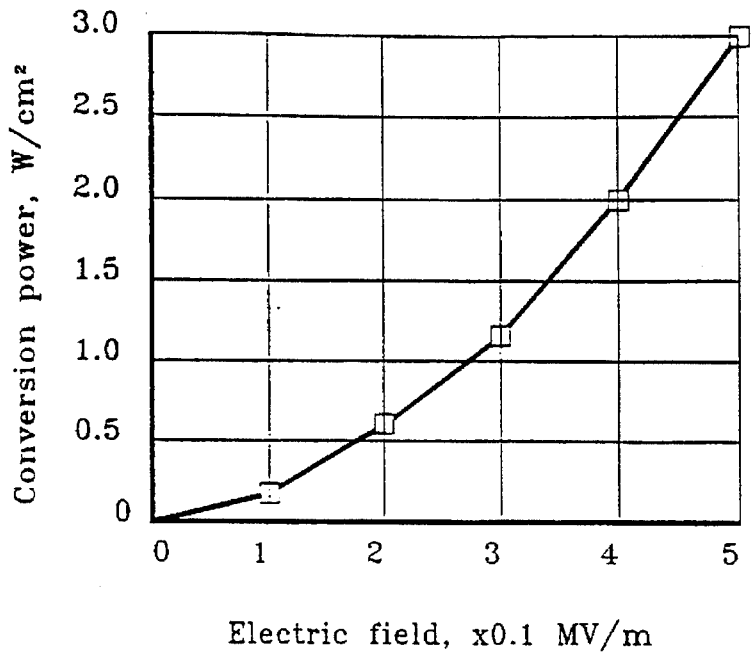
FIG. 21 is a graph of the conversion power density dependence for $LiTaO_3$ material on the driving electric field strength.

For a LiTaO$_3$ plate at ω=$10^6$ Hz, W equals 0.53 W/cm$^2$ for the switch according to FIG. 2 and 3.2 W/cm$^2$ for the switch according to FIG. 3. Calculation results are shown in FIG. 21. There is a possibility that the energy stored as the difference between the positive and negative cycles will be stored in the resonant circuit and will be stored by the pyroelectric material. The result is a higher amplitude during the next cycle and an equalization in the difference between switches in favor of higher value (see FIG. 4). In FIG. 4 the solid sine wave is the driving voltage V$_o$ and the dashed line V with increasing amplitude is the sum of the driving voltage V$_o$ and the pyroelectric voltage, V$_p$, where V(t)=V$_o$(t)+V$_p$(t). The amplitude increases until the circuit losses compensate for the losses associated with growth, which are proportional to the voltage amplitude. If the extracting voltage starts at a value V$_z$, (V$_z$>V$_o$), the extracted sectors are illustrated in FIG. 4 as the cross-hatched areas 30 under the sine curve. The electric circuit in this case must have a high frequency transformer with one winding forming a resonant circuit with the pyroelectric stack, a second winding for starting the driving voltage from a pulse generator, and a third (extracting) winding in series with a Zener diode having a V$_z$ threshold voltage and a full wave rectifier connected to a useful load. Until the voltage in the resonant circuit reaches V$_z$, this circuit is not extracting energy.

Figure 22:
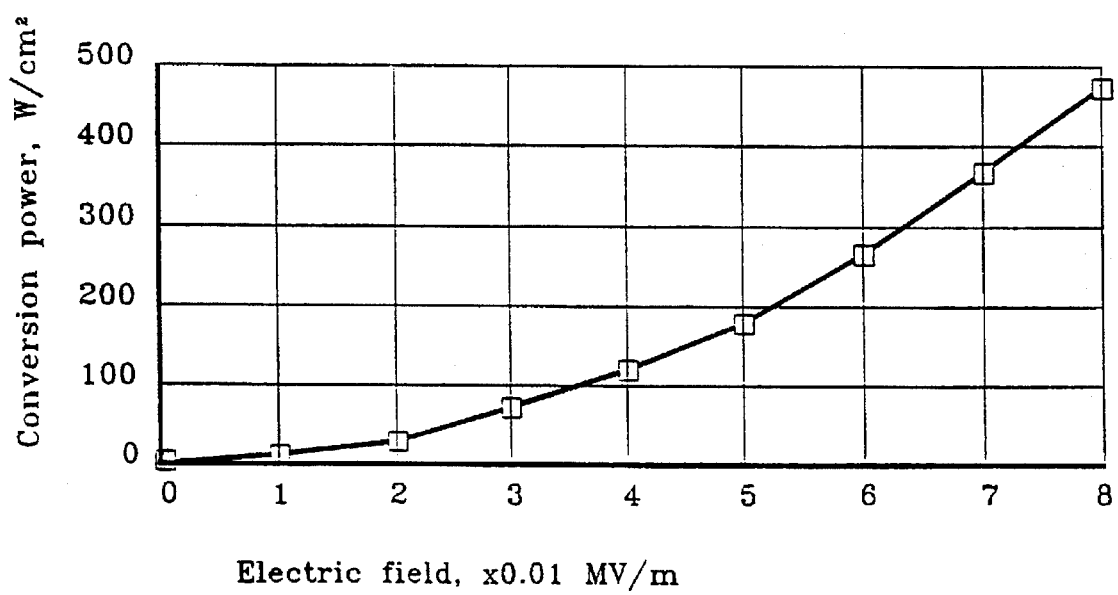
FIG. 22 is a graph of the conversion power density dependence for PZST material.

For PZST material and the same driving voltage, the converting power W corresponds to an unmanageable thousands of watts per square centimeter. Therefore, the driving voltage must be much lower (see FIG. 22). The figure of merit for a converter pyroelectric material as in 6.1 and 6.2 depends on α, which in itself is a figure of merit in pyroelectric infrared sensors. If α<<1, which is true for most pyroelectrics, the material figure of merit is:

$$F_1 = \frac{T_c p^2}{\rho C}, \quad (8)$$

where p is the pyroelectric coefficient, ρ is the density, and C is the thermal capacity. In this case, the material figure of merit does not depend on the dielectric constant. If α>>2 (i.e. for PZST), the figure of merit is:

$$F_2 = \frac{T_c^2 p^4}{\epsilon \rho^2 C^2}, \quad (9)$$

where ε is the dielectric constant.

The calculated power densities for efficient pyroelectrics, such as lead scandium tantalate (PST), or PZST having the same geometry, are in the range of 10–100 W/cm$^2$, which are very attractive for low temperature energy conversion.

For PVDF (Deuterated Polyvidilene Fluoride) at a driving electric field strength of 1 MV/m and ω$_o$ equal to 2×10$^6$ Hz at room temperature, the power density is approximately 0.5 W/cm$^2$.

Previously, it has been assumed that the heat flow from the electrodes 14 to the pyroelectric material 12 is replenished by the thermal gradient from the hot to cold heat sinks. When the power density is increased, dissipation losses tend to heat material 12 due to piezo-pyroelectric cycle, and the temperature of material 12 rises with power increase. This results in a countergradient, working against the hot and cold heat sink temperature difference. Part of the heat dissipates with the heat flow towards the cold heat sink and thus will not effect operation. However, part of the heat remains, thereby reducing the replenishing heat flow. When the temperature gradient across material 12 exceeds the pyroelectric gradient, the converter will not operate. This suggests that pyroelectric material 12 must be in better thermal communication with cold heat sink 18. This can be solved in various ways. The simplest, but not preferred approach, is to introduce additional thermal resistance on the hot heat sink 16, i.e., increasing the thickness of electric insulator 19 on the hot heat sink 16 side so that it is thicker than electric insulator 19 thickness on the cold heat sink 18 side. A more preferred embodiment is shown in FIG. 23. The design is similar to that shown in FIG. 1, with the addition of material 78 which has a lower thermal conductivity than pyroelectric material 12, including but not limited to pressed fiberglass or mica. Another embodiment is shown in FIG. 24. This design requires more complex technology, since both pyroelectric material 12 and electrodes 14 are made in a wedge form or other geometrical configuration where the electrode cross-section is the widest adjacent the cold heat sink. Because metal electrodes 14 are thicker near cold heat sink 18, the thermal communication is greater in this region. Acoustic resonance in this case is also much more complex between surfaces 80 and 82.

Another embodiment is shown in FIG. 25. Here the pyroelectric materials 12 are wedge-shaped, however, electrodes 14 are planar-shaped. Acoustic resonance occurs between surfaces 84 and 86. Pyroelectric material 12 is now in better thermal communication with cold heat sink 18. Passive wedge 88 comprises a material having a low thermal conductivity, including but not limited to mica for temperatures up to 1500° C. and KAPTON™ for low temperature (T<200° C.) applications. Porous materials, though having low thermal conductivity, are not preferred, as the sound attenuation for this class of materials is too high.

Figure 26:
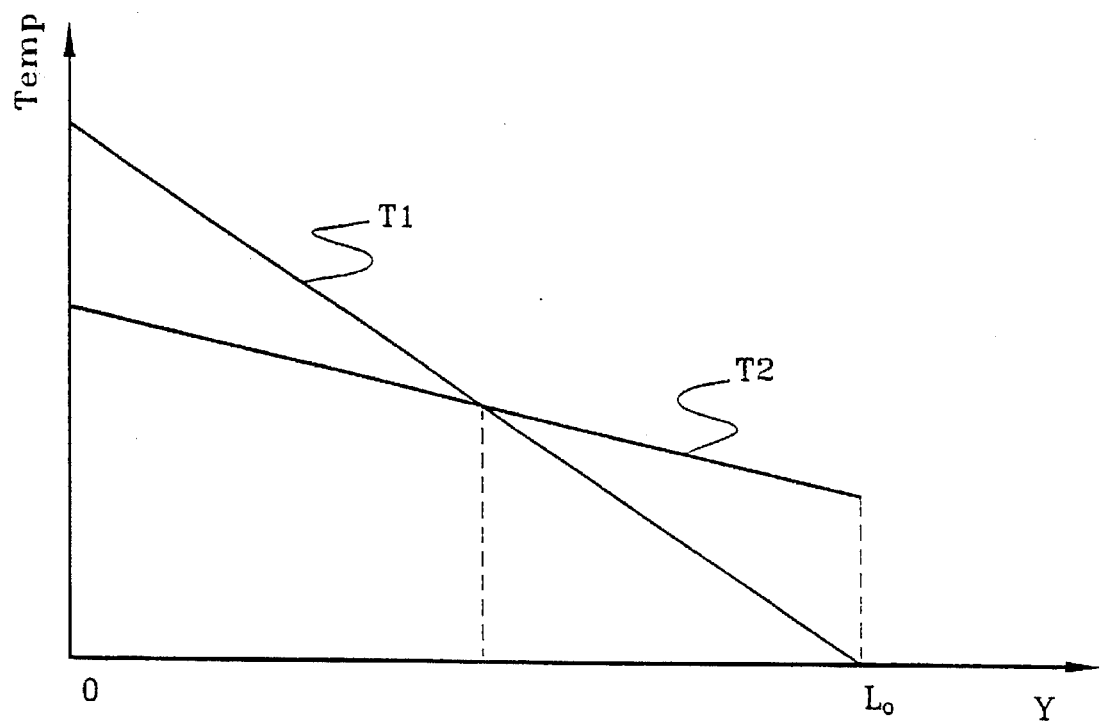
FIG. 26 illustrates the converting mode of the device shown in FIG. 1.
Figure 27:
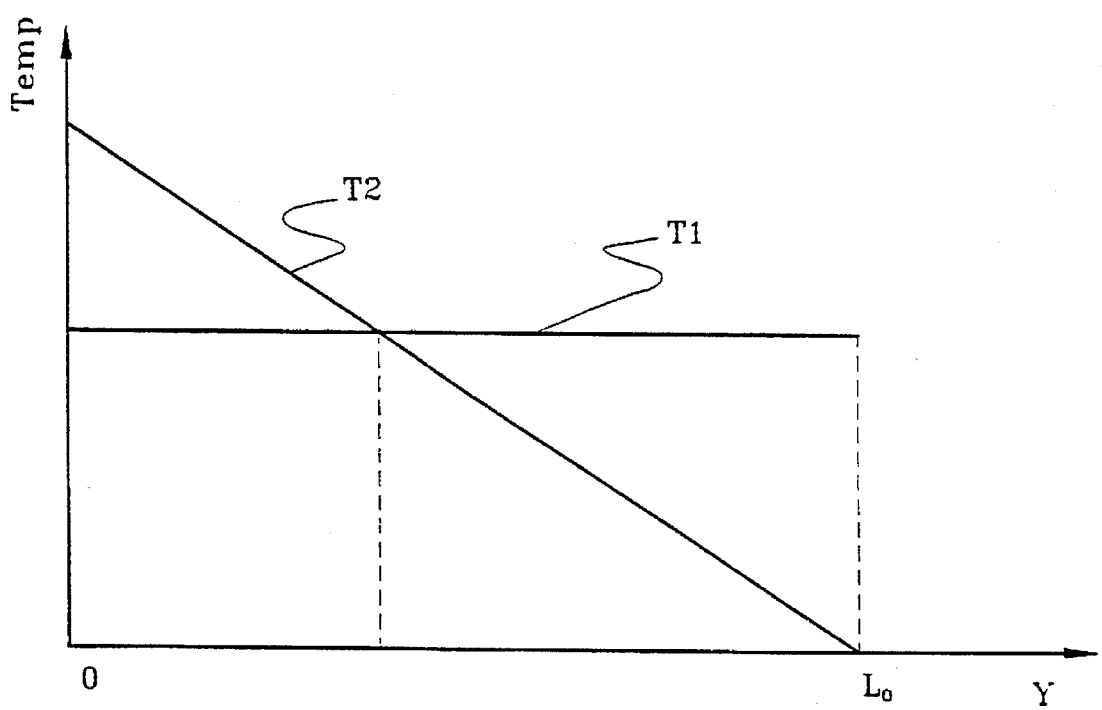
FIG. 27 illustrates the converting mode of the device shown in FIG. 1 with equal initial temperatures at the hot and cold heat sinks.

If no heat source is on the hot side and a driving voltage $V_o$ is applied, a refrigerator effect exists because the driving voltage and switching device cause asymmetric heat flow from electrodes 14 to the material 12 which is replenished from the heat sinks resulting in cooling. FIG. 26 represents the converting mode of the device shown in FIG. 1. Here, $T_1$ is the equilibrium temperature distribution along the Y-axis without driving voltage, $T_2$ is the equilibrium temperature distribution with driving voltage, with a maximum temperature at the hot heat sink and a minimum at the cold heat sink ($L_o$—plate length). Reference is now made to FIG. 27 with equal initial temperatures at the hot and cold heat sinks. $T_1$ represents the temperature distribution without driving voltage, and $T_2$ represents the temperature distribution with driving voltage. This is so because heat flows are asymmetric and remain as such, resulting in cooling a heat sink with better thermal communication. This process is less efficient than the conversion process since the net process depends on the absolute temperature squared. In other words, beginning at room temperature with a 30 K. available pyroelectric temperature gradient, the conversion is 1.49 times more efficient than refrigeration with the same device.

For very efficient pyroelectric materials, including but not limited to PZST, PST, and the like, this refrigerator can also work as an environmental heat pump after the initial start from an external power source providing electricity by cooling ambient air or a working fluid.

2. Thermodynamic Considerations

The two main modes of operation for the device include a heat pump/refrigerator, and a thermal to electric energy converter.

In terms of irreversible losses, the difference between these two modes is in external ohmic and transforming losses in the outer electric circuit. Since electric leads for the device can be made sufficiently thick and existing high frequency transformers have an efficiency of 0.9–0.95, ohmic losses in the converter mode may be approximately 10% higher for the same device.

Considering energies involved in terms of a time base equal to one second, the input electrical energy is $\omega_o \cdot (C_o V_o^2)/2$, where $\omega_o$ is the resonant frequency, $C_o$ is the capacitance, $V_o$ is the driving voltage amplitude, and (1−k) is dissipated in the form of thermal energy in the pyroelectric material. Referring to FIG. 1 with the hot heat sink temperature $T_2$ and the cold heat sink temperature $T_1$, heat flow to the device is $Q_o=(T_2-T_1)(\lambda_1 S_1+\lambda_2 S_2)$, where index 1 in the second bracket corresponds to the thermal conductivity and the cross section area of the metal electrode and index 2 corresponds to the pyroelectric material. According to equation (6.1) set forth previously, the extracted energy equivalent is $C_o V_o^2(2\alpha+\alpha^2)\times 0.785\times \omega_o$, where $\alpha$ is defined by equation (4) set forth previously. By definition, the extracted energy cannot be more than the difference between the heat flow through the electrode and the pyroelectric material.

The ratio of the extracted energy to the total heat passed through the device, $\eta$, defines the efficiency of the converter. Similar to other thermal machines, it appears like an ideal Carnot cycle efficiency (reversible cycle), multiplied by the irreversible losses cycle. If the formulae from the previous paragraph is substituted, the expression for the efficiency is too complex and does not allow for a simple interpretation as in the case of thermoelectric energy conversion. Assuming a best case scenario in all components of the efficiency, the dissipation portion can be as high as 0.8, or $\eta \approx K(T_2-T_1)/T_2$.

In the case of refrigeration and assuming that $\alpha \ll 1$ and most of the pyroelectric material stays at the cold heat sink temperature, the refrigeration coefficient $\zeta$ is as follows:

$$\zeta = \frac{T_1}{T_2-T_1} k \frac{1.7p^2\omega_o}{\epsilon\epsilon_o\rho C\left(\frac{\Sigma\lambda_i S_i}{C_o V_o^2}+\frac{(1-k)\omega_o}{2(T_2-T_1)}\right)},$$

where C is heat capacity of the pyroelectric material, $C_o$ is the electric capacity, $\epsilon$ is the relative dielectric constant, $\epsilon_o$ is the dielectric constant of vacuum, p is the density, $\rho$ is the pyroelectric coefficient, $V_o$ is the driving voltage amplitude, and $\omega_o$ is the driving frequency.

3. Materials

Two figures of merit, $F_1$ and $F_2$, for material 12 performance of the converter 10 were previously discussed where $F_1=T_c p^2/C\rho$ and $F_2=T_c p^4/\epsilon\rho^2 C^2$, wherein $T_c$ is the material 12 Curie temperature, p is the pyroelectric coefficient, C is the heat capacity, and $\rho$ is the density (all variables are in SI units). $F_2$ applies particularly to materials with extremely high pyroelectric coefficients, i.e. $p>10^2$ C/(m²·K).

$F_1$ can be used for the approximate material 12 evaluation. Two other parameters are present by default in evaluations, dielectric losses (tan δ) and electromechanical quality parameter $Q_m$. Both parameters define the efficiency of the converter 10 because the heat dissipated inside the material 12 itself is wasted. The best $Q_m$ values can be found in single crystal materials with values of $10^4-10^6$. For sintered ceramic materials, e.g., PZT, tan δ values are in the region of 0.1–10% and decrease with frequency. These losses also depend on the driving voltage. In reality, losses in acoustic resonance may be very low. The losses can be illustrated by monolithic multi layer actuators, which in many respects resemble the energy converter stacks of the present invention.

Figure 5:
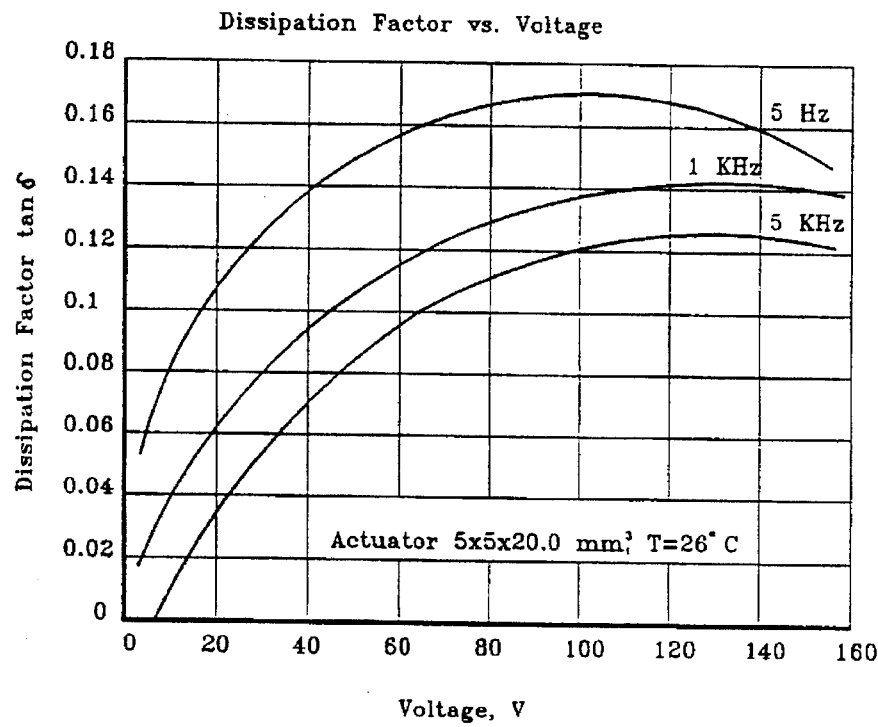
FIG. 5 shows the dissipation factor vs. voltage for a particular piezoceramic material.
Figure 6:
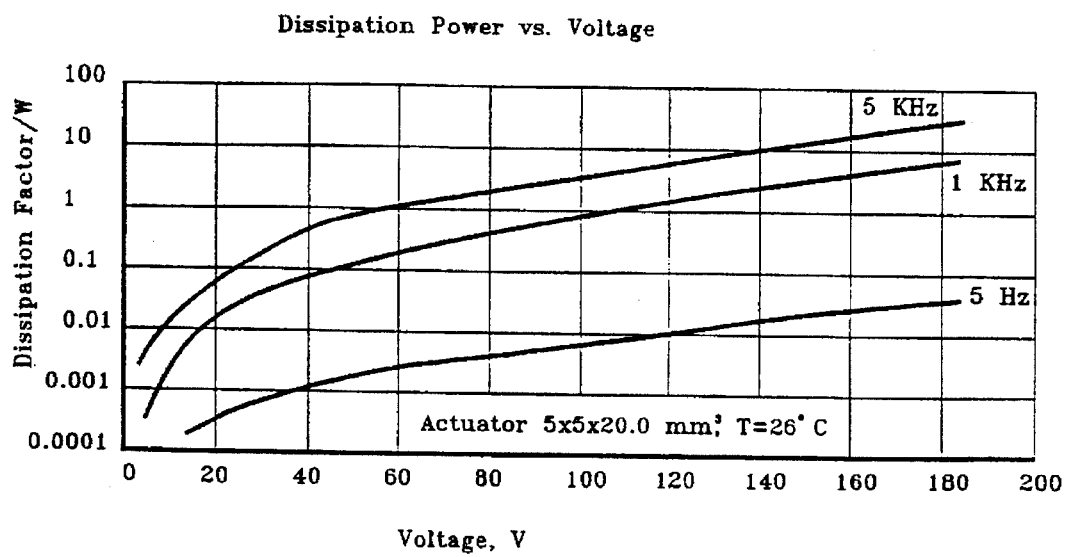
FIG. 6 shows the dissipation power vs. voltage for a particular piezoceramic material.

FIGS. 5 and 6 show dissipation losses in monolithic piezoceramic actuators made of PZT-type material. This stack has a resonant frequency of 60 kHz. If the stack had all of the features of a converter such as electrodes of solid metal and no coating, it should self-resonate at a driving voltage of 10 V, provided that a sufficient thermal gradient is applied with a plate thickness less than 70 microns at which the pyroelectric gain becomes larger than the integral losses.

For temperatures below 80° C., deuterated-polyvinylideneflouride (PVDF) is a preferred material because it can be produced economically with thin layers. Another preferred material is lead-zirconium titanate $Pb(Ti_{0.48}Zr_{0.52})O_3$ (PZT) based ceramics. Other materials include lead zirconate-stannate-titanate (Pb $(Zr_{0.43}Sn_{0.43}Ti_{0.14})O_3$ or PZST ceramics), lead scandium tantalate (PST) (PST & PZST require DC bias to avoid polarization, $LiTaO_3$, and $LiNbO_3$ for high temperature applications having K-values close to unity (see also Lang, S. B. *Sourcebook of Pyroelectricity*, New York, Gordon and Breach, Science Publishers, Inc., 1974, pp. 69–79, the contents of which are specifically incorporated herein).

Table 1 depicts the characteristics of select pyroelectric materials:

TABLE 1

| Material | Curie Temperature, K. | $F_1 = (T_cP^2/(C\rho)) \times 10^{-12}$ |
|---|---|---|
| PZT-5A | 640 | 29.6 |
| $BaNaNb_5O_{15}$ | 833 | 3.3 |
| PVDF | 355 | 0.136 |
| $BaTiO_3$ | 406 | 1400 |
| $LiNbO_3$ | 1483 | 3.4 |
| $LiTaO_3$ | 890 | 2.2 |
| $PbScTaO_x$ (PST) | 455 | $4 \cdot 10^8$ |
| $YMnO_3$ | 933 | 56 |
| PZST | 440 | $1.6 \cdot 10^6$ |

The preferred materials 12 have high pyroelectric coefficients and $F_1 > 10^{-12}$.

4. Electrodes

The electrodes are electrically and thermally conductive materials, including but not limited to most of the metals and some nitrides and carbides such as C, TiN, ZiN, HfN, TiC, ZrC, WC, or combinations or alloys thereof. Electrodes 14 are subject to high mechanical, electrical and thermal stresses, which increase diffusion of the metal electrode 14 into the material 12 and vice-versa. Hence, at high temperatures, electrodes 14 of typical materials such as Au, Au—Ni, Ag, Sn, Cr, Fe, Co, Pd, Ni, Cu, Al, Mg, Ag—Pd, or combinations and alloys thereof can have only limited applications. Use of heavy metals, including but not limited to Pt and Ir, for electrostrictive stacks improve the situation but may be cost prohibitive. The condition may be improved by placing diffusion barriers between the material 12 and electrode 14, including but not limited to SiC, SiN ($SiO_2$ is dielectric), or diamond-like electrically conductive coatings such as boron-doped diamond or other p-type diamonds. Other materials include W, Re, Os, Ir, Pt, Ag, Nb, Rh, Ru, Mo, Th, U, or combinations thereof. Some of these metals cannot operate in the air and require inert gas or vacuum as operation media.

Published results for electrostrictive stacks which operate at higher mechanical but lower thermal stresses are $10^{11}$–$10^{12}$ cycles, which corresponds to about three years of continuous operation at a 10 kHz frequency. Life cycles for pyroelectric energy converters should be similar.

The electrode 14 thickness can be defined from thermal conductivity considerations, which are illustrated in FIG. 1. Here, $T_{hot}$ and $T_{cold}$ are the temperatures of hot heat sink 16 and cold heat sink 18. Arrows 20, 22, and 24 show the heat flow propagation. The condition to define the thickness is governed by the following equation:

$$\Delta W_{cycle} \omega \geq \lambda \frac{T_{hot} - T_{cold}}{L} ld, \quad (10)$$

where $\Delta W_{cycle}$ is defined by equations (6.1) or (6.2), $\omega$ is the driving frequency, $\lambda$ is the electrode material thermal conductivity, L is the plate height, l is the plate width (electrode covers the entire plate), and d is the electrode 14 thickness. With a material 12 comprising a $LiTaO_3$ plate from the previous example and silver as an electrode 14 material, the electrode 14 thickness is approximately 1000 angstroms.

If the heat sink area is more critical than the piezo-pyroelectric material 12 cost, it is possible to change the specific power density by varying the specific area of the material 12 (simultaneously increasing the height of the material 12 and electrode 14 thickness). The theoretical limit for PZST with metal/diamond electrodes is around 1000 W/cm² for 1×1 cm² plates due to thermal conductivity limitations.

5. Design

The following example assumes a conversion of energy from a heat source providing a 100 K. temperature difference, and a stack of 100 (100 μm thickness) PZT-5A 1×1 cm² plates with matching thermal conductivity of electrical contacts (electrodes) between the leaves. Because the thermal conductivity of the contact metal is roughly 100 times greater than it is for PZT, their contribution to the stack thickness is negligible. The thickness of the stack is roughly 1 cm, giving a 1 cm³ cube. The thermal conductivity of this stack along the plates and electrodes results in a heat flow of 3.4 W/cm² (34 kW/m²). If the voltage at resonance is 3 V, a resonant frequency higher than 340 kHz is required, which is near the sound velocity divided by the length frequency (~400 kHz). This is close to first stack acoustic resonance harmonic. The actual resonant frequency will be affected by the compressing frame and thermal contacts since the resonant frequency of the piezoelectric stack depends on compression. (See, Aoyagi, M. et al., "High Torque Ultrasonic Motor Using Longitudinal and Torsional Vibrations" 1992 *IEEE Conference on Applications of Ferroelectrics*, pp. 541–544.) This reference indicates a 5% resonant frequency shift with force. Furthermore, the friction between the stack of plates and heat sinks acts like additional mass which shifts the resonant frequency.

Figure 7B:
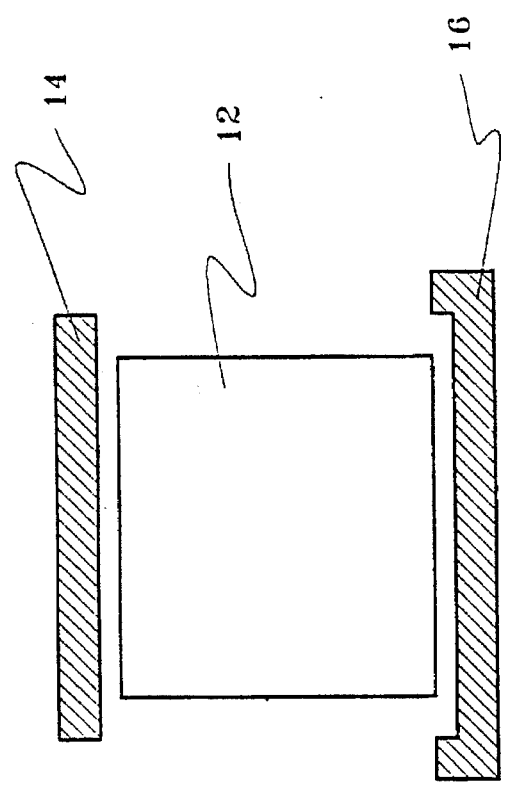
FIGS. 7a and 7b show heat sinks which serve to support a stack of pyroelectric materials.
Figure 7A:
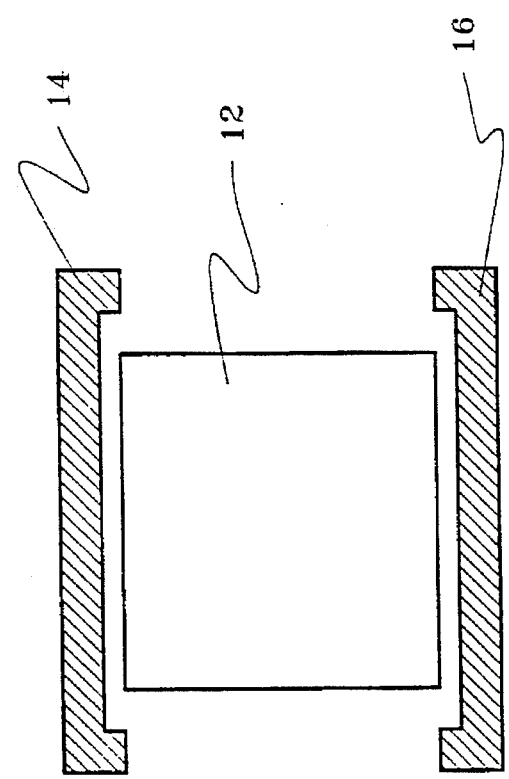

In order to drive a non-resonance circuit with a parallel plate connection, the same amount of energy produced would also be spent, therefore, rendering the device useless. With tan δ for PZT=0.005, theoretically 99.5% of the pyroelectric cycle energy may be extracted on a useful load, rendering the device nearly 50% of ideal Carnot cycle efficiency. In reality, there are a variety of losses such as mechanical, thermal and losses in the outer electrical circuit. However, the device may still be near ideal Carnot cycle, with the only serious physical limitation being the electromechanical coefficient of the material 12.

a. Description of the Design Elements (1) Heat Sinks. The main requirement for the hot heat sink 16 and the cold heat sink 18 is thermal conductivity. The thermal conductivity of a piezo-pyroelectric material 12 is low. For example, the thermal conductivity for PZT pyroelectric is only 1.7 W/m·K.). Basically, all metals or metal alloys will suffice, as long as the recrystallization point ($T_r$=0.4 $T_m$) is higher than the operating temperatures, the material does not oxidize in air, and the material can be polished and coated with an insulator material. The heat sinks 16 and 18 may also serve to support the material 12, as illustrated in FIGS. 7a and 7b.

Heat sinks 16 and 18 may be made of ceramic materials having good thermal conductivity and low electrical conductivity including, but not limited to, AlN, BeO, SiO$_2$, SiC, MgO, NiO$_2$, TiB$_2$, W$_2$B$_5$, and SiN. In this case, the internal surface must be polished and there is no need for an electric insulator 19 shown in FIG. 1. Aluminum nitride is a material with a significantly higher hardness than PZT or any metal, ensuring low friction between the material 12 and heat sinks 16 and 18, and low losses. Another possibility is to coat the material 12 with a thermally conductive dielectric such as non-doped diamond, aluminum, aluminum nitride, aluminum oxide, zirconium oxide, titanium oxide, yttrium oxide, magnesium oxide, beryllium oxide, silicon oxide (glass or quartz), nickel dioxide, scandium oxide, hafnium oxide, lanthanoid oxides, thorium oxide, and uranium oxide. In this case, heat sinks 16 and 18 may be graphite or a metal with thermally conductive graphite lubrication.

(2) Electric Insulator. Either heat sinks 16 and 18 or material 12 may be coated with an insulator. The following materials may be used at the indicated maximum operating temperatures: TEFLON (<150° C.), KAPTON (<250° C.), Al$_2$O$_3$ or AlN (<2700° C.), MgO, NiO$_2$, SiO$_2$, and BeO. If the material 12 is made by co-firing with painted electrodes, thermal contact surfaces with a dielectric material should preferably be painted and fired simultaneously. The painted surface must then be polished to ensure good thermal contact. Graphite lubrication lowers the requirements for planar surfaces and smoothness since thermal resistivity is essential, it is also beneficial to have an insulator with a high, comparable to metal, thermal conductivity i.e. AlN, even if it is thin, because more than half of the total thermal flow goes through electrodes 14, which have very good thermal conductivity and thus require low contact losses.

(3) Converter Stack (a) Pyroelectric material thickness. The material 12 thickness is affected by the allowed voltage, technology and cost. More charge can be extracted per area unit in one cycle as the material 12 thickness is decreased, thereby improving the performance. For PZT-5A the initial depolarization field is 0.5 V/micron. For a 3 volt operating voltage it corresponds to 6 microns and 20 microns for reliable operation. For sintered PZT, the preferred thickness is at least about 50 microns, which is close to the limit set by depolarization. Utilizing a thin film deposition method, the material 12 may be made very thin, with the limitation set by metal contacts. Below 300 Å, material 12 exhibits quantum effects that effect its electrical conductivity. This limits material 12 thickness to 1–3 microns with an operating voltage of a fraction of volts, for example, 0.5 volts for a PZT-5A plate having a thickness of one micrometer.

(b) Material to Electrode Thickness Ratio At the minimal required frequency $f_{min}$ and when all of the heat flow along electrode 14 contact is converted to electrical energy, the approximation of optimal contact thickness is defined as $$t > t_o \frac{\lambda o}{\lambda m} \cdot k,$$

where t and $t_o$ are the thicknesses of electrode 14 and material 12 respectively, $\lambda m$, $\lambda o$ are the thermal conductivities of electrode 14 and material 12 respectively, and k is the electromechanical coupling coefficient (efficiency) in the compression mode. Precise values for given temperatures are given by equation (10) set forth previously.

Another option for the converter 10 design is to increase the thickness of material 12. In the same planar geometry the effect should be the same, e.g., the material 12 thickness increased ten times. This results in a ten-fold decrease in the capacitance, a ten-fold increase in the mass, and a ten-fold increase in the voltage. As a result, the temperature difference and energy extracted will be the same, but at a higher voltage and higher losses. The difficulty is that the thermal reaction time decreases. Another difficulty is the high voltage of a few hundred volts per millimeter of material 12 thickness, which is detrimental to the switches, transformers, and insulation. Because of these problems, the maximum practical material 12 thickness is limited to about one millimeter.

(c) Pyroelectric material length. Depending on the temperature gradient, pyroelectric material and required power density the material 12 length between heat sinks 16 and 18 may be varied, with lengths less than 50 mm allowing for higher specific heat flow per area unit. For sintered ceramics, lengths below 1–2 mm may not be practical because of contact problems.

(d) Material shape. The shape of the material 12 is preferably in the form of a plate and may vary as illustrated in FIGS. 8a through 8e.

Figure 8A:
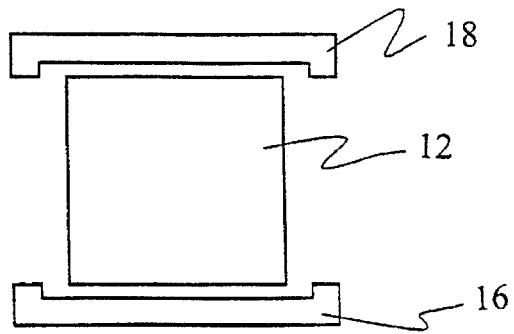
FIGS. 8a through 8e are various pyroelectric plate and heat sink configurations.
Figure 8B:
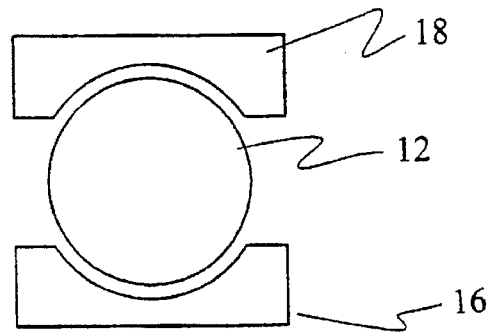
Figure 8C:
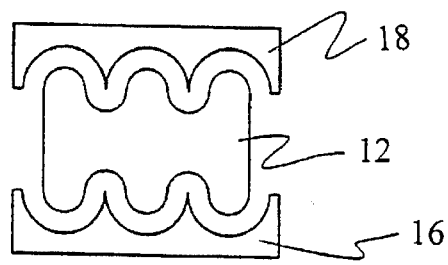
Figure 8D:
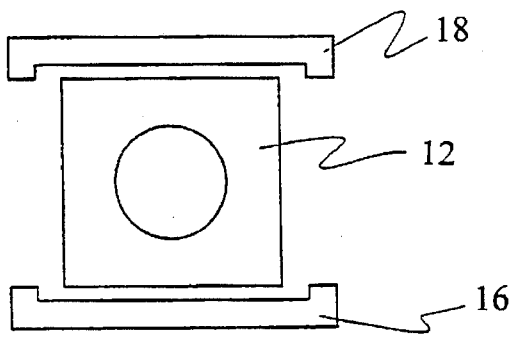
Figure 8E:
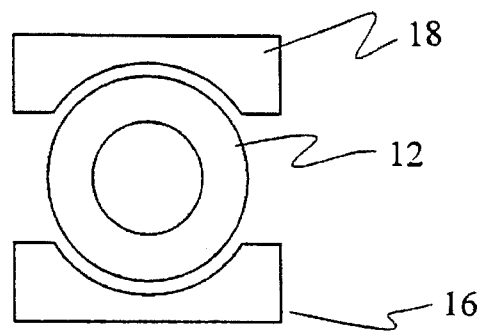

The configurations illustrated in FIGS. 8b and 8c have higher thermal contact surfaces. The configurations shown in FIG. 8d and FIG. 8e have holes in the plates for a more compact compression frame design.

Hypothetically, a very high voltage converter may be constructed in geometries different from a stack of plates including, but not limited to one or more rods with central and surface electrodes having an acoustic wave traveling from one end to another, thus allowing low resonant frequencies (see, e.g., piezoelectric materials available from Morgan Matroc-Electro Ceramics Div., Lake Forest, Calif.).

(e) Thermal Contacts. Dry and liquid thermal contacts may be utilized between material 12 and heat sinks 16 and 18. Dry contacts may be used with or without lubrication. When using contacts without lubrication, the surfaces of material 12 and heat sinks 16 and 18 must be planar and polished. During preparation stages, a small amount of fine abrasive powder may be used between material 12 and heat sinks 16 and 18, which will lead to automatic surface finishing during operation. A combination of graphite with Al$_2$O$_3$, or boron nitride or diamond powder may be used.

Figure 9:
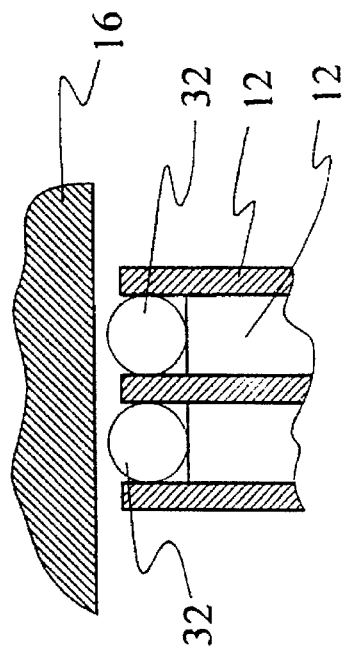
FIG. 9 is a stack of pyroelectric materials with grooves for holding a liquid metal thermal contact.

Liquid lubrication may not be preferred for the following reasons. Due to an acoustic-capillar effect, liquid lubrication will tend to fill every gap between the plates and push the plates apart, thus changing the resonant frequency. At lower temperatures there are many available dielectric liquids, and the stack immersed in liquid will work at its specific frequency. At elevated temperatures liquid metals are an option. When using liquid metals, the plates must be hermetically sealed, i.e., co-fired and insulated. Co-firing technology is standard in multi-layer stack fabrications. This process involves wet ceramics and wet layers of metallized ceramics powder (electrodes) being pressed together at high temperatures (roughly 1000° C.) to form a monolithic stack. When utilizing hermetically sealed plates, material 12 or heat sinks 16 and 18 should have grooves for holding the liquid metal 32 in place (see FIG. 9).

(4) Compressing frame. A compressing frame is required for holding the plates together, even if the plates are co-fired to assure long life. Compression compensates for cracks and voids in the plates and for gaps between the materials comprising the stack, while maintaining the structural integrity of each material. The frame may be either internal or external to the plates, with an internal frame giving a more compact design. The difference between the converter frame and known electrostrictive stack designs (See, Aoyagi, M., *IEEE 9th International Conference on the Application of Ferroelectrics*, (1992) pp. 541–544, the contents of which are specifically incorporated herein) is that the thermal conductivity of the converter frame must be small relative to the stack and the frame elements must withstand converter operating temperatures.

Figure 10B:
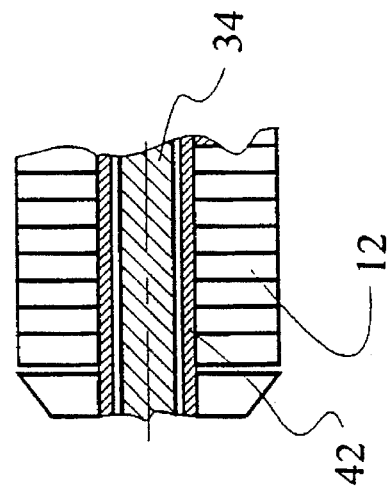
FIG. 10a and FIG. 10b are stacks of pyroelectric materials having an internal compressing frame for creating a piezoelectric effect.
Figure 10A:
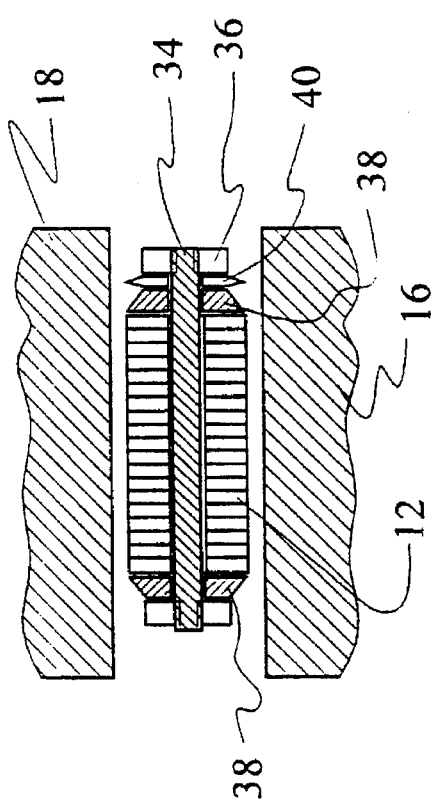

Examples of internal frame designs are shown in FIGS. 10a and 10b. In the design shown in FIG. 10a, a stack of plates (material 12) is compressed by means of tightening nut 36 on central rod 34 along which the stack is disposed. Disposed between the stack of plates and nut 36 are compression washers 38 and springs 40. Compressing washers 38 also act as thermal insulators and are made of a material with a low thermal conductivity, including, but not limited to MACOR™ or other ceramics, together with nut 36. Compressing washers 38 may also be made of a metal with a low thermal conductivity (FIG. 10b), including but not limited to Ni—Cr alloy, enclosed in a dielectric tube 42. Spring 40 provides for a uniform load over a wide temperature range and is particularly recommended if the electrical circuit does not include electronic correction for resonance. A low thermal conductivity of the frame is essential to minimize the losses due to heat exchange at elevated temperatures (more than 200°–300° C.).

An external compressing frame may be integrated either with one or more materials 12 with either heat sink 16 or 18. FIGS. 11a and 11b are two examples of a stack integrated frame. In the embodiment shown in FIG. 11a, the stack of one or more materials 12 are disposed in compressing frame 44 and are compressed by tightening bolt 48, which is threaded through compressing frame 44, against the stack. Washers 46 are disposed on both ends of the one or more materials 12. Spring 40 is disposed on the end of the stack having bolt 48. FIG. 11b is a top view of the embodiment shown in FIG. 11a and illustrates thermal contact with heat sinks 16 and 18. The construction materials preferably should have a low thermal conductivity. If the operating temperatures are low enough, i.e., below 200°–300° C. where radiation heat exchange is small compared to the thermal conductivity of the stack, the frame may be made of, including but not limited to, metal, ceramics and composites.

FIGS. 12a and 12b illustrate a heat sink integrated frame. FIG. 12a illustrates an internal frame, and 12b illustrates an external frame. Another embodiment is shown in FIG. 12c, illustrating a simplistic assembly. In the embodiments shown in FIGS. 12a–12c, one or more materials 12 are disposed between compressing elements 54 and supporting element 50, which are compressed by tightening compressing element 54, including but not limited to a bolt which is threaded through compressing element 54, against the stack. Dielectric washers 52 are placed on both ends of one or more materials 12. Dielectric washers 52 are needed to evenly distribute compression on one or materials 12. Washers 52 must have mechanical strength and a thermal conductivity of less than about 1 W/(mK). The operative temperature range of washer 52 must be higher than the hot heat sink temperatures. For most applications, MACOR™ machinable ceramics are adequate. Mica-based ceramics, composites, and high temperature ceramics may also be utilized.

6. Resonance

The resonant converter stack 10 resembles ceramic resonant filters and resonant activators with a long history of manufacturing and applications. If the stack is made of a uniform material, resonant conditions will be as follows:

$$n\frac{\lambda}{2} = L,$$

where L is the stack thickness, $\lambda$ is the acoustic wave length, and n=1, 2, 3, . . . (harmonic number or overtone). The wavelength is defined as $\lambda=c/f$, where c is the speed of sound in the material and $f$ is the frequency. Thus, the resonant frequency is:

$$f = \frac{nc}{2L}.$$

Normally, minimum losses occur at $n=1(f_o)$. In our case it is inconsequential, since even at n=1, the resonant frequency is very high at about 10 MHz/mm for PZT-5A. The actual frequency $f_o$ depends on many parameters such as the electrode thickness, the electrode material, the compression frame, the compression force, the environment (gas air liquid), temperature and friction. For frequencies lower than 10 MHz the stack must be sufficiently thick to accommodate 10 MHz/mm conditions. Actuators with about a 100 kHz resonant frequency have a thickness of about 2 cm. As set forth previously, the minimum frequency required for efficient converter operation depends on the pyroelectric material 12. For lead scandium tantalate, the resonant frequency should be roughly $10^6$ times less than it is for PZT-5A at the same geometry and electric input. However, fabrication of a long stack (when the stack length is more than the height or width) creates other problems such as plate parallelism, sound attenuation, and increasing losses.

The resonance width is important because it defines the required stability of the electrical circuit, which may be a problem in the case of changing temperatures and vibrations. The resonance width $\Delta f$ is defined as the frequency deviation which provides resonance (see FIG. 13). Since the capacitance changes with the temperature, it is beneficial to keep cold and hot heat sinks at constant temperatures. Otherwise, the electric circuit must have frequency correction means.

For ceramic filters, $$\frac{\Delta f}{f}$$

is normally 1–3%. These values apply even to simple LC circuits. If it is less than 1% it may require individual circuit tuning for each stack.

To this point, a pure compression mode of the stack has been addressed, which can be affected by an external spring or end mass. This mode is easy to understand and control, however, the reported frequency is apparently higher than 10 kHz (see FIG. 14).

Figure 14:
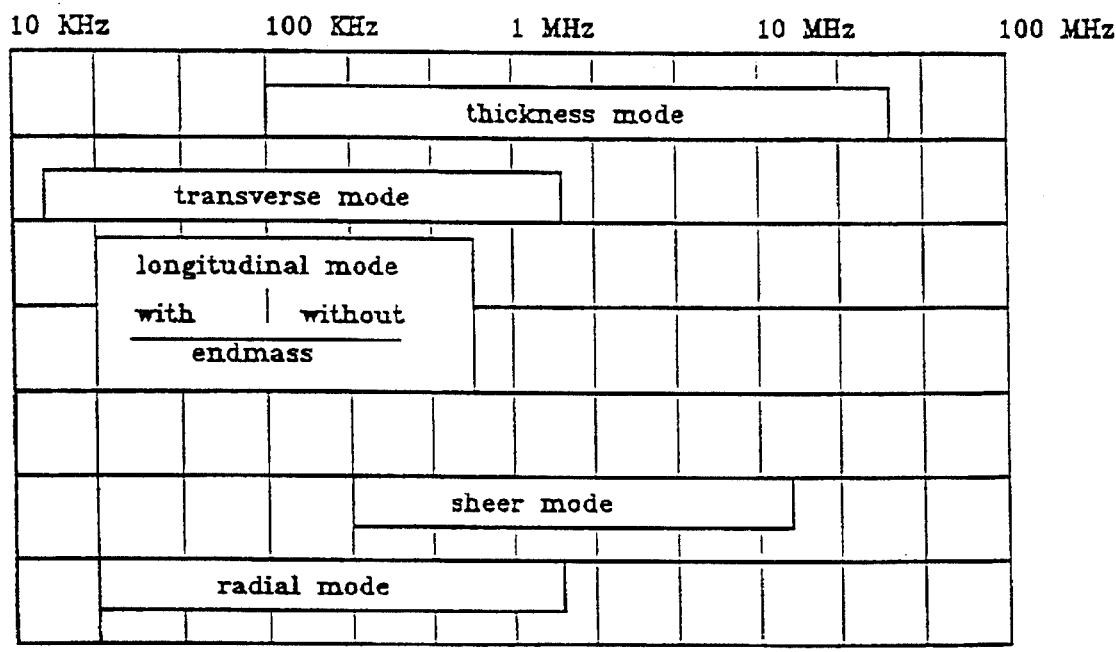
FIG. 14 is a chart of frequency for various oscillation modes of a particular pyroelectric material.

FIG. 14 shows that irrespective of the vibrational mode, frequencies below 10 kHz must be evaluated. Note that even a 10 kHz frequency corresponds to about a 30 year life for a PZT-made stack.

Figure 28:
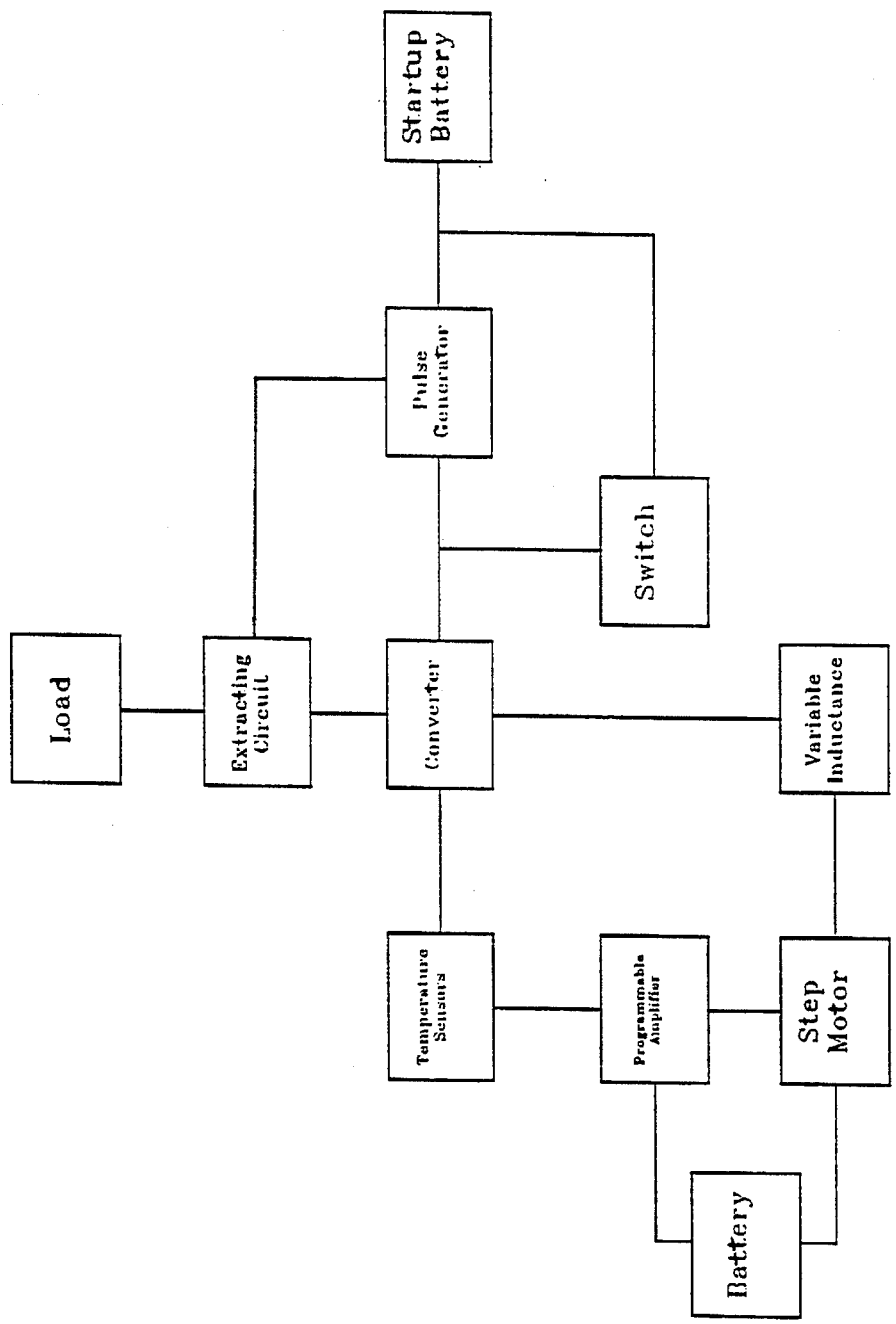
FIG. 28 is a block diagram of a frequency adjusting system.

For complex and powerful systems, i.e., W>1 kW, working over a wide temperature range, a different approach for a converter system is employed. Though acoustic resonance frequency variation with temperature is not dramatic, it exists and causes a shift. Much more important is the change in relative dielectric constant $\epsilon$ of the pyroelectric, which can easily change by a factor of 2. Consequently, inductance L in the resonant electric circuit must be adjusted correspondingly using variable inductance (transformer with moving core). The frequency may also be adjusted using a variable capacitance device connected in series or in parallel with the capacitor stack. For variable inductance, both the stack acoustic resonance $\omega_o$ and capacitance $C_o$ are calibrated in terms of L=L(x), where x is the core position. A standard satellite tracking system may be used for frequency adjustment, comprising temperature sensors, a programmed amplifier and a step motor. A block diagram of the entire frequency adjusting is shown in FIG. 28. A more complicated system may include a computer-controlled measuring system which measures $\omega_o$ during periods without load and adjusts variable inductance correspondingly. It may also control the driving voltage, the heat source (hot heat sink temperature), etc. Hence, either the hot or cold heat sink temperature is controlled, or the frequency is controlled, or a combination thereof.

7. PST-Based Device

Figure 15:
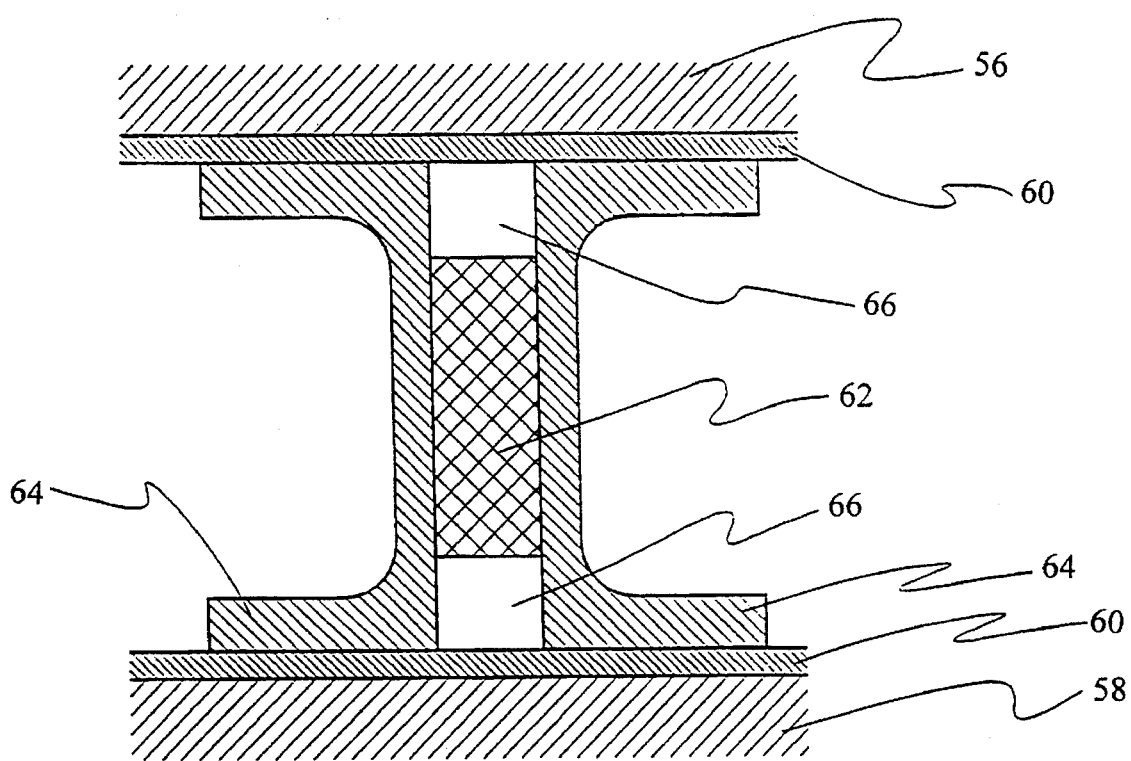
FIG. 15 is a cross-section view of a converter utilizing a PST-based pyroelectric material.

Recent developments on Lead Scandium Tantalate compositions (PST) resulted in a material with extremely high values of pyroelectric coefficient (See, Patel, A. et al. "Ferroelectric Ceramics and Thin Films for Uncooled Thermal Imaging Arrays" *9th IEEE International Symposium on Applications of Ferroelectrics*, Penn State University, U.S.A. Aug. 7–10 (1994) pp. 647–652). Because of its properties ($p=2.5$ $C/(K \cdot m^2)$) this material does not need a resonant stack to overcome inefficiencies. As a result, the limiting factor is the thermal conductivity of the metal electrodes. For a one volt driving voltage at ten kilohertz and a $1 \times 1$ cm$^2$ plate with a thickness of 1 mm the converting power is about 30 W. This system requires copper or silver electrodes with a thickness of about 1 mm for an electrode length of 1 cm. The design of the converter in this case, as illustrated in FIG. 15, is somewhat different from the stacked pyroelectrics disclosed previously, because a pyroelectric stack and thin electrodes are not required. In this embodiment, the PST material 62, preferably in the form of a plate, is disposed between U-shaped electrodes 64 in thermal contact with hot heat sink 56 and cold heat sink 58. The electrodes 64 are U-shaped to overcome contact thermal resistance through a larger contacting area. Disposed between electrodes 64 and heat sinks 56 and 58 are electric insulators 60. Gap 66, comprising air, gas, vacuum, or a breakdown resistant material such as a dielectric, exist between PST material 62 and electric insulators 60 because electrodes 64 are sufficiently thick to provide mechanical stability on their own. Gap 66 must withstand the voltage potential between electrodes 64. Gap 66 increases the efficiency of the converter by eliminating heat flow from material 62 to heat sinks 56 and 58. Gap 66 is not necessary for the side adjacent to the cold heat sink 58.

Figure 16:
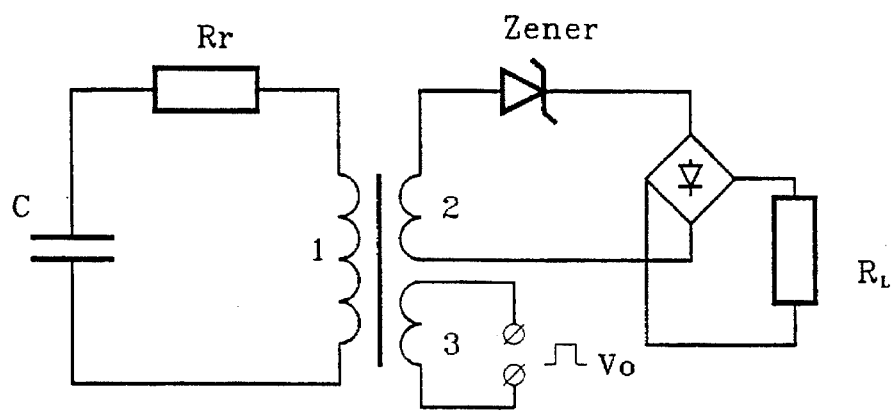
FIG. 16 is one embodiment of an electrical circuit for extracting electrical energy from a pyroelectric converter.
Figure 17:
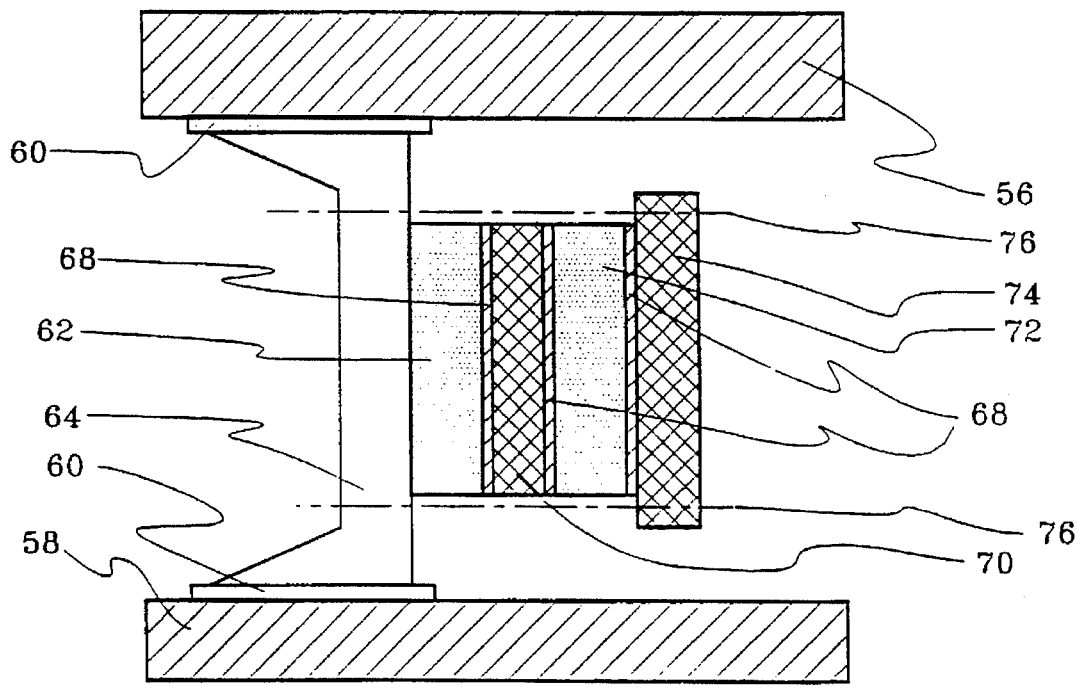
FIG. 17 is a cross-section view of an acoustically coupled PST-based pyroelectric converter.

The energy extracting electrical circuit for PST is similar to that shown in FIG. 16. However, measures should be taken to protect the pulsed or sine wave generator from pyroelectric voltage, which can be as high as a few kilovolts for this material. Therefore, the electric insulation 60 must be capable of withstanding the pyroelectric voltage. One way to avoid high voltage on the output of the generator is to have acoustic coupling. Here, the generator is driving the piezoelectric plate (PZT-5A) which is electrically insulated from the PST plate, but acoustically coupled to it. Acoustic oscillations of PST produce an oscillating voltage on the plate and pyroelectric action as a result. The corresponding design is shown in FIG. 17. In this embodiment, the following elements are disposed in compression between U-shaped electrode 64 and compressing member 74 in the following succession: PST material 62, electrode 68 electric insulator 70, electrode 68, piezoelectric material 72, and electrode 68 in the form of a plate. Electrode 68 comprises a solid metal or alloy, including but not limited to Ag or Au/Ni, with a thickness of at least about 100 microns.

Electric insulator 70 should withstand high voltages of about 1 kV and temperatures up to 180° C. Most glass and ceramic insulators are adequate at thicknesses of at least about 100 microns. Plastics such as KAPTON or TEFLON are also adequate.

Electrode 68 is a standard electrode coating on piezoelectric material, which is about 0.25µ Ni or Au—Ni. Ag or Ag/Pd alloys are also suitable. The piezoelectric material must be operable up to about 180° C. temperatures. Most of the standard PZT compositions are adequate. The design of FIG. 17 corresponds to a rugged design providing for high mechanical and electrical strength. A main consideration with this kind of device is that all the air gaps must be wide enough to withstand about 1 kV AC, i.e., a gap of at least about 1 cm. The converter must also have cover protection against moisture or be filled with freon to prevent breakdowns.

The elements just described between electrode 64 and compressing member 74 are compressed by compressing system 76, including but not limited to a bolt threaded through compressing member 74 and electrode 64. Electrodes 64 and 68 are connected to an extracting circuit, such as that shown in FIG. 16. Dielectric layer 70 is capable of withstanding a kilovolt range voltage from PST and having a low ultrasound attenuation, including, but not limited to, quartz or dense aluminum oxide. Piezoelectric plate 72 is made of any material with a Curie point higher than PST (180° C.). Piezoelectric plate electrodes 68 are connected to a sine wave or pulse generator. Compressing member 74 is preferably made of an electric insulator. Bolted to electrode 64 are bolts made of an insulator, such as MACOR™, or metal which is insulated on the surface. Electrode/thermal conductor 64 is electrically insulated from the heat sinks 56 and 58 by insulators 60, preferably AlN insulators. The extracting circuit is basically the same as in FIG. 16, except the Zener diode (actually Schottky diodes stack) must now handle kilovolt range voltage, and the extracting transformer windings are from high voltage to low and not vice-versa as before. The oscillating voltage generator can be powered either from an external battery or from an extracting circuit, with an external battery used only for start up. Computer controlled starter and converter efficiency optimization, by changing the driving frequency on piezoelectric 8, can be employed if the device power is in the kilowatt range.

8. Electrical Circuit

The devices for removing electrical charge from the capacitor stack are either amplitude sensitive or phase and amplitude sensitive.

FIG. 16 shows a resonant circuit formed of pyroelectric Capacitor C and winding No. 1 as an inductance which forms a resonant contour with the pyroelectric stack. Losses in this circuit (resistance of the leads) are reflected by resistance $R_r$. Winding 1 with inductance L is experimentally tuned to the resonant frequency of this stack at room temperature. As the temperature increases on the stack, its capacitance shifts, so the circuit is tuned to the specific temperature range, for example 300–350 K. In principle, this condition can be solved by using variable transformers (with a moving core). Winding 2 is positioned across the Zener diode and the rectifier. The Zener is constructed of a number of Schottky diodes in series. Each diode (MBR 340) gives a drop of about 0.3 V with a limiting frequency of 100 MHz. The rectifier is made of the same Schottky diodes. Rectified current is used on the load $R_L$. Winding 3 is used to start converter operation by function generator (Hewlett Packard Model 8116A). The stack operating voltage is adjusted by changing the number of diodes in a Zener diode.

Another device comprises a switch comprising an inductance forming a resonant contour with a capacitor and a transformer having first, second, and third windings, the first winding connected with a Zener diode and in parallel with the resonant contour, the second winding connected to a full wave rectifier, and the third winding connected to a generator.

The resonant frequency is defined by the acoustic resonance of the stack and is dependant upon parameters such as thickness, material, compression, temperature and friction. The resonance frequency $\omega_o$ of the external circuit, is governed by the following equation:

$$\omega_o = \frac{1}{2\pi\sqrt{LC}} . \qquad (11)$$

With a stack 1 cm long consisting of 70 micron thick PZT-5A plates connected in parallel, the capacitance is equal to 3 μF, giving inductance L from eq. 11 as $9.4 \times 10^{-8}$ H. This inductance was achieved with an air filled coil having a diameter of about two millimeters and five turns. At resonance, the reactive impedance is compensated for and only ohmic resistance exists. Ohmic losses for sine wave AC look like $0.5 \times V_o^2 \times R_r$. At 10 V it corresponds to $50 R_r$ watts. This stack according to equation (6) gives 0.1 W at a 200 K temperature gradient. Hence, the wire resistance must be less than $2 \times 10^{-3}$ ohms. With a 3 mm² diameter copper wire and a winding plus contacts length of 10 cm, the resistance is about $0.5 \times 10^{-4}$ ohms and ohmic losses are 25% of the converter output. The electrodes on the plates provide about 60% of the additional ohmic losses, thus limiting the overall efficiency to about 15% of the possible output. Another roughly 5% of the losses come from the stack itself, leaving only about 10% of 0.1 W. The thickness of the electrodes are preferably thicker than the ones used, because most of the heat flow will pass through without conversion, thereby further decreasing the converter efficiency.

The solution for PZT-5A is to make the nickel electrodes about 0.5 to 1.0 micron thick, but not to allow the metal to touch the heat sinks on both sides, thus limiting the heat flow through the pyroelectric stack. Materials with high ($p >> 10^{-2} - 10^{-3}$ C/K·m²) pyroelectric coefficients, do not have these problems, as the output is sufficient to compensate for any ohmic losses.

The Zener diode gives a threshold voltage of 10 V, plus another 0.5 V comes from diodes in the rectifier. When the driving voltage with a 10 V amplitude from a pulse generator with the same resonant frequency is applied to winding 3, a resonance in the contour is obtained. However, nothing happens in winding 2, since its impedance is close to infinity. As the amplitude of the generator pulse is increased, the condition illustrated in FIG. 4 occurs. When the pulse amplitude reaches the threshold voltage, the Zener diode starts to conduct current and DC current flows through the load $R_L$. The generator may be switched off, since the losses will be automatically compensated for by pyroelectric action.

Figure 19:
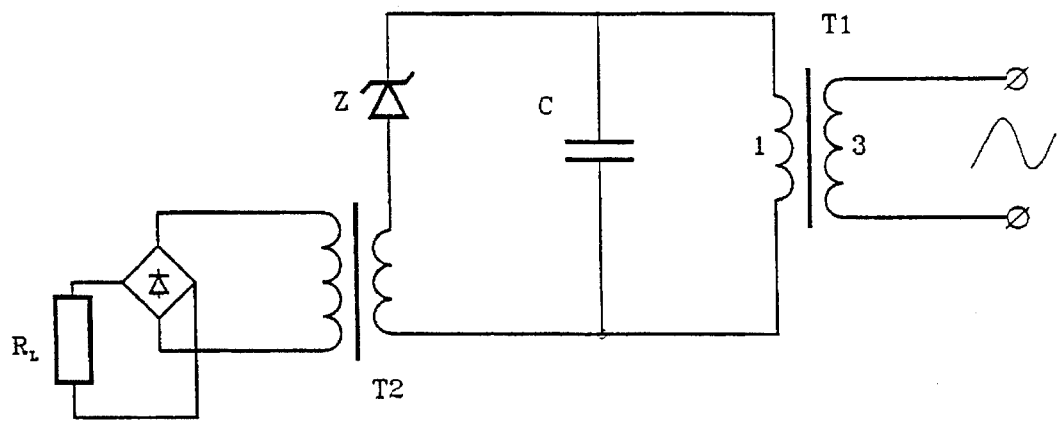
FIG. 19 is another embodiment of an electrical circuit for extracting electrical energy from a pyroelectric converter.

At high frequencies ($\omega_o > 1$ MHz) and high capacitance ($C_o > 1$ μF) of the stack, the transformer inductance required to form a resonant circuit is less than one microhenry. If the transformer is of a conventional type with coiled windings, it is difficult to retain high efficiency since a core cannot be utilized to keep a magnetic flux inside the transformer. In this case, the circuit shown in FIG. 19 is preferred. It does not have extracting winding 2, but operates in the same manner as the circuit in FIG. 16. The difference is that the limiting factor is now the operating frequency of the diodes which can be as high as 100 MHz for Schottky diodes. The Zener diodes may be Schottky diodes connected in series, 0.3–0.7 V per diode, for example, 30 diodes for $V_z = 10$ V.

Figure 18:
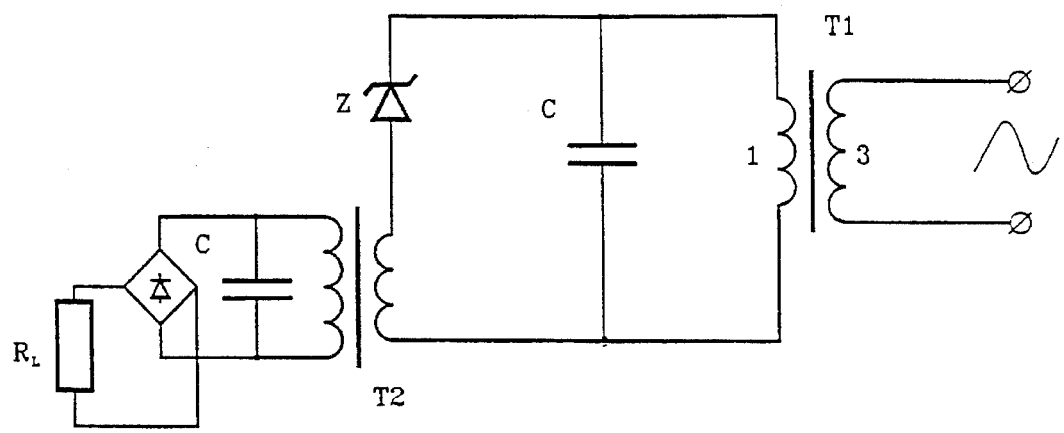
FIG. 18 is another embodiment of an electrical circuit for extracting electrical energy from a pyroelectric converter.

The circuit shown in FIG. 18 was designed with the assumption that the pyroelectric component of the voltage was large enough to be used as is, i.e., for PZST it is two times larger than the driving voltage, or a few volts. If this assumption is incorrect as in the case of PZT-5A material, it must have an additional high frequency transformer. However, unlike $T_1$ this one does not have to be a low inductance transformer and can be very efficient (See FIG. 19). For PZT-5A, the windings ratio in $T_2$ must be $10^2 - 10^3$.

Figure 20:
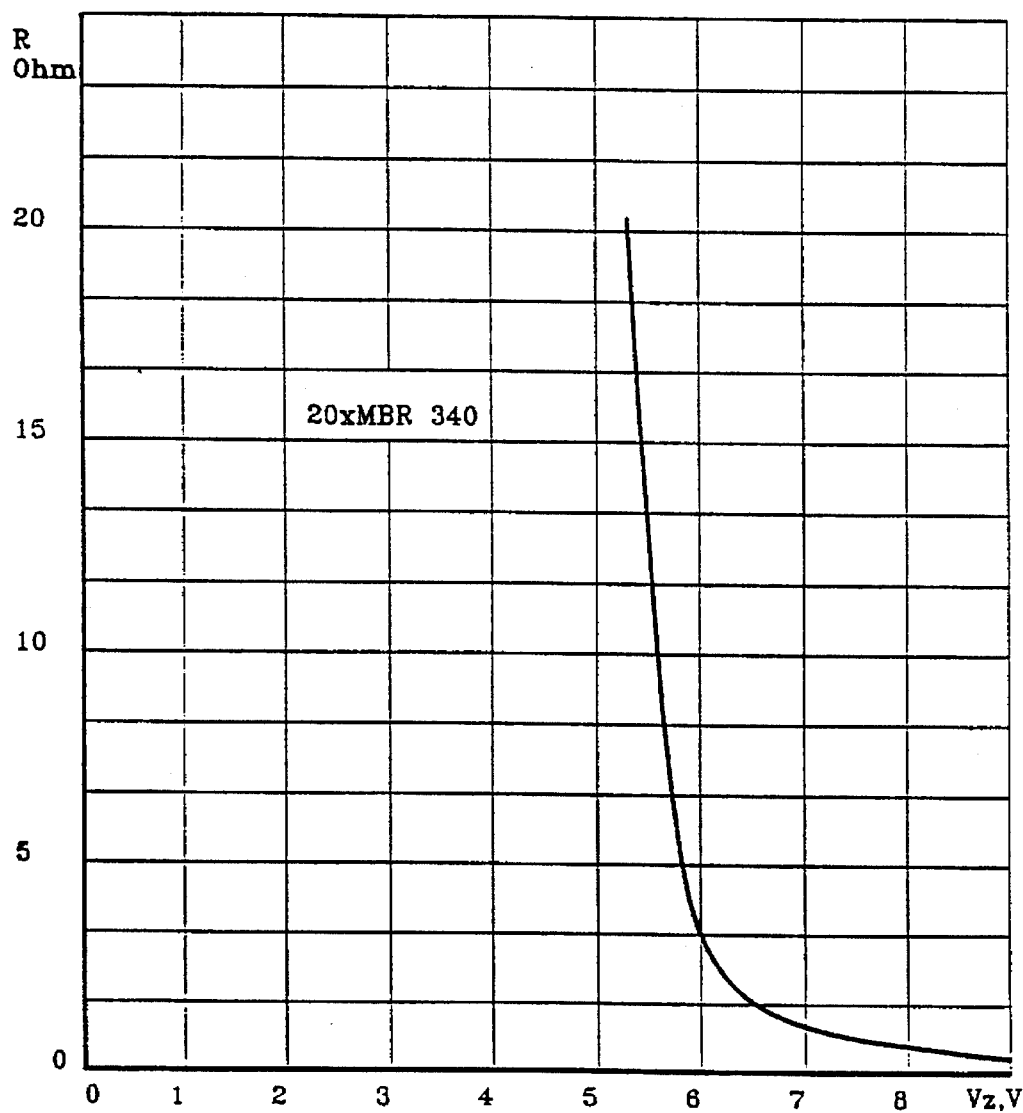
FIG. 20 is a graph of recalculated dependence of extracting circuit resistance on voltage.

FIG. 19 represents a resonant stack with an equivalent capacitance of 4 microfarads. The Zener diode is formed of 20 Schottky diodes (Motorola MBR 340), connected in series having voltage rate of change 10000 V/microsecond. The recalculated dependence of resistance on voltage for this stack $R_z = R_z(V)$ is shown in FIG. 20 (Ohm vs. $V_z$.) The resistance at 5 volts is effectively infinity and at ten volts is zero. High frequency (1 MHz rated) power transformer $T_2$ has a primary winding resistance of $R_o = 10$ ohms. The rectifier bridge has a maximum operating frequency of 40 MHz and the load resistance is ten ohms. Low resistance winding 1 of a transformer $T_1$ forms a resonant contour with the stack C. The resonant frequency of the stack is 500 kHz. Resonance is initiated by winding 3 from the function generator. When resonant voltage $V_o$ is lower than 5 volts, current does not flow through transformer $T_2$ because the Zener diode Z blocks it. When current begins to flow, it flows through the resistance $R_o + R_z$ and the extracted power is:

$$W = \frac{(V_o \sin(\omega t) - V_z)^2}{R_o + R_z} .$$

Integrating this equation by time gives an average extracted power of about 0.05 W at $V_o = 10$ V. Estimated component ratings circuit losses are 8% and can be lower with a more efficient transformer $T_2$. With a pyroelectric power gain of 0.5 W and stack internal losses of about 0.1 W, a reasonably efficient extracting circuit exists.

The circuits illustrated in FIGS. 18 and 19 are assembled on the same principle as that shown in FIG. 16. The Zener diode and rectifier may be constructed not only of MBR 340 Schottky diodes, but of any commercial diodes handling high frequency and currents of up to at least about 1000 A at low losses and at any required voltage. For example, 100 diodes can sustain 10 kV.

The switch may take the form of many circuits. It may comprise a resonant contour formed of the pyroelectric capacitor and inductance L, where the contour is driven by a pulse/sine generator. If the generator has a high output impedance (1>1 kΩ), it may be connected directly across the resonant contour. In one embodiment, inductance L is the first winding of a high frequency transformer (of at least the resonant frequency of the capacitor) and a second winding is connected to the generator. Another embodiment comprises a resonant contour formed of a pyroelectric capacitor and inductance L, where the contour is driven by a pulse/sine generator, inductance L is the first winding of a high frequency transformer (of at least the resonant frequency of the capacitor) and a second winding is connected to the generator, and the contour is connected in parallel to an extracting circuit which comprises a Zener diode and a first winding of a high frequency transformer (of at least the resonant frequency of the capacitor), and a second winding of the transformer is connected to a useful load through a rectifier. Part of the useful load may also feed the generator.

Also, the generator may be powered by a start-up battery having a timer which is part of the useful load.

9. Applications

Since energy conversion is the basis of modern civilization, an efficient energy converter has numerous applications, such as existing utility power plants, solar power plants, residential electricity supplies, residential/ solar electricity supply, automotive, maritime, solar/ maritime, environmental heat pump, refrigeration (cooling, air conditioning, etc.), and aerospace.

Power plants have a tremendous amount of waste heat with a potential of 300° C. and lower. Converting the waste heat at 30–50% of Carnot efficiency will give an additional 15–25% overall plant efficiency with equivalent savings on fuel.

The proliferation of low-cost converters will lower the capital costs of solar concentrator power plants with a higher efficiency than current steam/electricity cycles. Lower operating temperatures will also lower maintenance costs.

Residential electric supplies based on direct heat to electrical energy conversion is ideal for remote areas, where it is difficult or inconvenient to install power lines. The heat source may either be in the form of fossil fuel or solar concentrators. Solar concentrators can be also in the form of solar heated water pools, utilizing day/night temperature differences. A few hundred cubic meters of water with a hundred square meters of surface and cover could provide the electricity supply for a house in areas with a temperature differential of about 10° C.

A pyroelectric converter in combination with a conventional engine driving an electric generator and an electric motor would substantially increase mileage.

Direct energy conversion has tremendous application in electric cars. Three main approaches are possible. One approach involves using inexpensive materials with operating temperatures up to about 150° to 300° C. as overall efficiency boosters. A car with an electric drive has a conventional engine coupled with an electric generator having a converter array as an intermediate radiator.

Another approach utilizes high temperature converters with operation temperatures of about 1000° C. This type of car will have fewer moving parts, higher combustion temperatures, and lower emissions. Currently, high-efficiency furnaces have a thermal efficiency of about 90–95%, which is much higher than internal combustion efficiencies. In combustion engines with about 50% Carnot efficient converters, the mileage would improve roughly two to three times over existing automobiles with similar characteristics.

Automotive applications are also applicable to maritime applications. In addition, solar concentrators may be used in a sail-type fashion. A combination of light and inexpensive plastic Fresnel lenses with pyroelectric converters may be incorporated into modern rigid wing-type sails, providing for the use of wind and sun energy to propel a boat with about 100–200 W/m$^2$ of the sail solar component.

Since the converter can utilize very small temperature gradients in a self-sustaining mode, a temperature gradient between the heat sinks will be created with asymmetric heat exchange on the surface (e.g. one heat sink can be thermally insulated). Also, the system will run until something malfunctions, cooling the environment and producing electricity. The power densities will be low, as a reasonable developed gradient can be only a few degrees. However, the energy consumption in its normal sense is zero. This device must have additional features, such as a guaranteed electric load in order to not disrupt operation. This will bring a useful power density down further. Notwithstanding, the possible benefits far outweigh the technical hurdles.

In summary, the method and apparatus disclosed herein is a significant improvement from the present state of the art of pyroelectric energy conversion.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An energy conversion device, comprising:
   one or more plates formed of piezo-pyroelectric material;
   thermally conductive electrodes interleaved with said one or more plates forming a capacitor;
   hot and cold heat sinks in thermal communication with said electrodes;
   means for holding said one or more plates together;
   means coupled to said capacitor for applying voltage and resonant frequency thereto; and
   means coupled to said capacitor for removing electrical charge therefrom created from piezo-pyroelectric effects.

2. A device defined in claim 1, wherein said one or more plates comprises PZT, $BaNaNb_5O_{15}$, PVDF, $BaTiO_3$, $LiNbO_3$, $LiTaO_3$, $PbScTaO_x$, $YMnO_3$, or PZST.

3. A device defined in claim 1, wherein said electrodes comprise electrically and thermally conductive materials.

4. A device defined in claim 1, wherein said electrodes comprise Au, Au—Ni, Ag, Pd, Ni, Cu, Al, Mg, Ag—Pd, or combinations or alloys thereof.

5. A device defined in claim 1, wherein said electrodes comprise C, TiN, ZiN, HfN, TiC, ZrC, WC, or combinations or alloys thereof.

6. A device defined in claim 1, wherein said electrodes comprise Pt or Ir.

7. A device defined in claim 1, further comprising diffusion barriers disposed between said one or more plates and said electrodes.

8. A device defined in claim 7, wherein said diffusion barriers comprise SiC or SiN.

9. A device defined in claim 7, wherein said diffusion barriers comprise doped-diamond electrically conductive coatings.

10. A device defined in claim 7, wherein said diffusion barriers comprise W, Re, Os, Ir, Pt, Au, or combinations thereof.

11. A device defined in claim 1, wherein said hot and cold heat sinks comprise metal or metal alloys.

12. A device defined in claim 11, further comprising thermally conductive graphite lubrication disposed on said metal or metal alloys.

13. A device defined in claim 1, further comprising an electric insulator disposed between the capacitor and the heat sinks.

14. A device defined in claim 13, wherein said electric insulator comprises TEFLON, KAPTON, $Al_2O_3$, AlN, MgO, $NiO_2$, $SiO_2$, or BeO.

15. A device defined in claim 1, wherein said hot and cold heat sinks comprise ceramic material.

16. A device defined in claim 15, wherein said ceramic material comprises BeO, AlN, $SiO_2$, SiC, $MgO_2$, $NiO_2$, $TiB_2$, $W_2B_5$, or SiN.

17. A device defined in claim 1, wherein said hot and cold heat sinks comprise a thermally conductive dielectric material coated on the one or more plates.

18. A device defined in claim 17, wherein said dielectric material comprises aluminum nitride, non-doped diamond coatings, aluminum oxide, zirconium oxide, titanium oxide, yttrium oxide, magnesium oxide, beryllium oxide, silicon oxide, nickel dioxide, scandium oxide, hafnium oxide, lanthanoid oxides, thorium oxide, or uranium oxide.

19. A device defined in claim 1, wherein said hot and cold heat sinks comprise graphite.

20. A device defined in claim 1, wherein said holding means comprises a compressing frame internal to said one or more plates.

21. A device defined in claim 20, wherein said compressing frame comprises:

a rod centrally disposed to said one or more plates, said rod having first and second ends; and compressing elements disposed on the first and second ends for applying a compressive force to the one or more plates.

22. A device defined in claim 21, wherein said first and second ends include threads and the compressing elements comprise threaded nuts.

23. A device defined in claim 22, further comprising compression washers disposed between the one or more plates and the threaded nuts.

24. A device defined in claim 23, wherein said compressing washers are disposed on a dielectric tube.

25. A device defined in claim 20, wherein said compressing frame comprises:

one or more supporting elements rigidly secured to the hot or cold heat sink; and a rod disposed internal to the one or more plates and having a first and second end, said first end being rigidly affixed to said one or more supporting elements and the second end having a compressing element for applying a compressive force to the one or more plates.

26. A device defined in claim 25, wherein said second end includes threads and the compressing element comprises a threaded nut.

27. A device defined in claim 26, further comprising dielectric washers disposed between the one or more supporting elements, the one or more plates, and the threaded nut.

28. A device defined in claim 1, wherein said holding means comprises a compressing frame external to said one or more plates.

29. A device defined in claim 28, wherein said compressing frame comprises:

first and second supporting elements rigidly secured to the hot or cold heat sink; and a compressing element threadably engaged with said first supporting element for applying force to said one or more plates.

30. A device defined in claim 29, further comprising thermal insulator washers disposed between the one or more plates and said compressing frame and said compressing element.

31. A device defined in claim 30, further comprising a spring disposed between said compressing element and said washer.

32. A device defined in claim 31, wherein said compressing frame is formed with the hot or cold heat sinks.

33. A device defined in claim 1, wherein said means for applying voltage and resonant frequency $\omega_o$ comprises a function generator, and resonant voltage being governed by the equation $V(t)=V_o\sin(\omega t)$, and said resonant frequency $\omega_o$ being governed by capacitor internal acoustic resonance and related to the resonant circuit by the equation $$\omega_o = \frac{1}{2\pi\sqrt{LC}},$$

where L is the inductance and C is the capacitance of the capacitor.

34. A device defined in claim 1, further comprising frequency adjusting means for varying the resonant frequency due to acoustic resonance frequency variation.

35. A device defined in claim 34, wherein said frequency adjusting means comprises a variable inductance device.

36. A device defined in claim 34, wherein said frequency adjusting means comprises a variable capacitance device connected in series or in parallel with said capacitor.

37. A device defined in claim 1, further comprising means for controlling hot or cold heat sink temperature or a combination thereof.

38. A device defined in claim 1, further comprising means for controlling hot sink temperature and resonant circuit frequency.

39. A device defined in claim 1, wherein said charge removal means comprises a switch comprising a resonant contour formed of said capacitor and an inductance, said contour being driven by a pulse/sine or function generator.

40. A device defined in claim 39, wherein said generator has an output impedance of at least about 1 k$\Omega$ and is connected directly across said resonant contour.

41. A device defined in claim 39, wherein said inductance comprises a first winding of a transformer having a frequency of at least said capacitor resonant frequency and a second winding being connected to said generator.

42. A device defined in claim 1, wherein said charge removal means comprises a switch comprising:

a resonant contour formed of said capacitor, said contour being driven by a pulse/sine or function generator;

an inductance, said inductance being a first winding of a transformer having a frequency of at least said capacitor resonant frequency, said transformer having a second winding connected to said generator; and an extracting circuit connected in parallel to said contour, said extracting circuit comprising a Zener diode and a first winding of a transformer having a frequency of at least said capacitor resonant frequency, said transformer having a second winding connected to a useful load through a rectifier.

43. A device defined in claim 42, wherein part of said useful load feeds the generator.

44. A device defined in claim 42, wherein said generator is powered by a start-up battery having a timer which is part of the useful load.

45. A device defined in claim 1, wherein said hot and cold heat sinks are at a temperature differential when said voltage is applied.

46. A device defined in claim 1, wherein said hot and cold heat sinks are at equal temperatures when said voltage is applied.

47. A device defined in claim 1, wherein said one or more plates and said electrodes are wedge-shaped, said electrodes having a widest cross-section adjacent said cold heat sink.

48. A device defined in claim 1, wherein said one or more plates are wedge-shaped and said electrodes are planar-shaped.

49. A device defined in claim 48, further comprising a passive wedge-shaped material.

50. A device defined in claim 49, wherein said passive wedge-shaped material comprises mica or KAPTON™.

51. An energy conversion device, comprising:
one or more plates comprising lead scandium tantalate;
thermally conductive electrodes interleaved with said one or more plates forming a capacitor;
electric insulators being adjacent to said electrodes;
hot and cold heat sinks in thermal communication with said electric insulators, said electric insulators disposed between said hot and cold heat sinks and said electrodes;
means coupled to said capacitor for applying voltage thereto; and
means coupled to said capacitor for removing electrical charge therefrom created from pyroelectric effects.

52. A device defined in claim 51, wherein said electrodes are U-shaped, having left and right legs and a bottom whereby the left and right legs are in thermal communication with the electric insulators and the bottom being adjacent to said plate.

53. A device defined in claim 51, wherein a gap is disposed between the plate and the hot heat sink.

54. A device defined in claim 53, wherein said gap comprises air, gas, or vacuum.

55. A device defined in claim 51, wherein a gap is disposed between the plate and the cold heat sink.

56. A device defined in claim 55, wherein said gap comprises air, gas, or vacuum.

57. A device defined in claim 51, wherein said voltage means comprises a pulse generator.

58. A device defined in claim 51, wherein said voltage means comprises a sine wave generator.

59. A device defined in claim 51, wherein said charge removal means comprises a switch comprising a resonant contour formed of said capacitor and an inductance, said contour being driven by a pulse/sine or function generator.

60. A device defined in claim 59, wherein said inductance comprises a first winding of a transformer having a frequency of at least said capacitor resonant frequency and a second winding being connected to said generator.

61. A device defined in claim 51, wherein said charge removal means comprises a switch comprising:
a resonant contour formed of said capacitor, said contour being driven by a pulse/sine or function generator;
an inductance, said inductance being a first winding of a transformer having a frequency of at least said capacitor resonant frequency, said transformer having a second winding connected to said generator; and
an extracting circuit connected in parallel to said contour, said extracting circuit comprising a Zener diode and a first winding of a transformer having a frequency of at least said capacitor resonant frequency, said transformer having a second winding connected to a useful load through a rectifier.

62. A device defined in claim 61, wherein part of said useful load feeds the generator.

63. A device defined in claim 61, wherein said generator is powered by a start-up battery having a timer which is part of the useful load.

64. A device defined in claim 51, wherein said hot and cold heat sinks are at a temperature differential when said voltage is applied.

65. A device defined in claim 51, wherein said hot and cold heat sinks are at equal temperatures when said voltage is applied.

66. An energy conversion device, comprising:
a capacitor, said capacitor including a U-shaped electrode, a plate comprising lead scandium tantalate adjacent said U-shaped electrode, a second electrode in the form of a plate adjacent said plate comprising lead scandium tantalate, an electric insulator adjacent said second electrode, a plate comprising PZT-5A adjacent said electric insulator, and a third electrode in the form of a plate adjacent said plate comprising PZT-5A;
a means for holding said capacitor together;
electric insulators, said U-shaped electrodes having first and second legs and a bottom, said electric insulators being adjacent to said first and second legs and said bottom being adjacent to said plate comprising lead scandium tantalate;
hot and cold heat sinks in thermal communication with said electric insulators, said electric insulators disposed between said hot and cold heat sinks and said first and second legs of said U-shaped electrode;
means coupled to said capacitor for applying voltage thereto; and
means coupled to said capacitor for removing electrical charge therefrom created from piezo-pyroelectric effects.

67. A device defined in claim 66, wherein said voltage means comprises a pulse generator.

68. A device defined in claim 66, wherein said voltage means comprises a sine wave generator.

69. A device defined in claim 66, wherein said charge removal means comprises a switch comprising a resonant contour formed of said capacitor and an inductance, said contour being driven by a pulse/sine or function generator.

70. A device defined in claim 69, wherein said inductance comprises a first winding of a transformer having a frequency of at least said capacitor resonant frequency and a second winding being connected to said generator.

71. A device defined in claim 66, wherein said charge removal means comprises a switch comprising:
a resonant contour formed of said capacitor, said contour being driven by a pulse/sine or function generator;
an inductance, said inductance being a first winding of a transformer having a frequency of at least said capacitor resonant frequency, said transformer having a second winding connected to said generator; and
an extracting circuit connected in parallel to said contour, said extracting circuit comprising a Zener diode and a first winding of a transformer having a frequency of at least said capacitor resonant frequency, said transformer having a second winding connected to a useful load through a rectifier.

72. A device defined in claim 71, wherein part of said useful load feeds the generator.

73. A device defined in claim 71, wherein said generator is powered by a start-up battery having a timer which is part of the useful load.

74. A device as defined in claim 66, further comprising a material having a lower thermal conductivity than said one or more plates, said material disposed between said one or more plates and said hot heat sink.

75. A device defined in claim 74, wherein said material comprises pressed fiberglass or mica.

76. A device defined in claim 66, wherein said hot and cold heat sinks are at a temperature differential when said voltage is applied.

77. A device defined in claim 66, wherein said hot and cold heat sinks are at equal temperatures when said voltage is applied.

78. A method of converting energy comprising the steps of:
   a) holding together one or more plates formed of piezo-pyroelectric material having thermally and electrically conductive electrodes interleaved with said one or plates forming a capacitor, and said electrodes in thermal communication with hot and cold heat sinks;
   b) applying a voltage and resonant frequency to said capacitor; and
   c) removing electrical charge created by piezo-pyroelectric effects from said capacitor.

79. A method defined in claim 78, wherein said hot and cold heat sinks are at a temperature differential when said voltage is applied.

80. A method defined in claim 78, wherein said hot and cold heat sinks are at equal temperatures when said voltage is applied.

81. A method of converting energy comprising the steps of:
   a) holding together one or more plates formed of lead scandium tantalate having thermally and electrically conductive electrodes interleaved with said one or plates forming a capacitor with electric insulators adjacent to said electrodes, and said electric insulators disposed between hot and cold heat sinks and said electrodes;
   b) applying a voltage to said capacitor; and
   c) removing electrical charge created by pyroelectric effects from said capacitor.

82. A method defined in claim 81, wherein said hot and cold heat sinks are at a temperature differential when said voltage is applied.

83. A method defined in claim 81, wherein said hot and cold heat sinks are at equal temperatures when said voltage is applied.

84. A method of converting energy comprising the steps of:
   a) holding a capacitor together, said capacitor comprising:
      a U-shaped electrode;
      a plate comprising lead scandium tantalate adjacent said U-shaped electrode;
      a second electrode in the form of a plate adjacent said plate comprising lead scandium tantalate;
      an electric insulator adjacent said second electrode;
      a plate comprising PZT-5A adjacent said electric insulator; and
      a third electrode in the form of a plate adjacent said plate comprising PZT-5A;
      said capacitor further comprising electric insulators, said U-shaped electrodes having first and second legs and a bottom, said electric insulators being adjacent to said first and second legs and said bottom being adjacent to said plate comprising lead scandium tantalate, and hot and cold heat sinks in thermal communication with said electric insulators, said electric insulators disposed between said hot and cold heat sinks and said first and second legs of said U-shaped electrode;
   b) applying a voltage to said capacitor; and
   c) removing electrical charge created by piezo-pyroelectric effects from said capacitor.

85. A method defined in claim 84, wherein said hot and cold heat sinks are at a temperature differential when said voltage is applied.

86. A method defined in claim 84, wherein said hot and cold heat sinks are at equal temperatures when said voltage is applied.

* * * * *

UNITED STATES PATENT AND TRADEMARK OFFICE
CERTIFICATE OF CORRECTION

PATENT NO. : 5,644,184
DATED : July 1, 1997
INVENTOR(S) : Kucherov

Page 1 of 2

It is certified that error appears in the above-identified patent and that said Letters Patent is hereby corrected as shown below:

Column 4, line 31, delete "pressure" and replace with --polarization--.

Column 5, line 19, delete "$\eta$" and replace with --$\rho$--.

Column 5, line 43, delete "$3 \times 10^8$" and replace with --$3 \times 10^{-8}$--.

Column 6, line 60, delete "$\eta$" and replace with --$\rho$--.

Column 10, line 39, before "dielectric", add --relative--.

Column 10, line 39, delete "p" and replace with --$\rho$--.

UNITED STATES PATENT AND TRADEMARK OFFICE
CERTIFICATE OF CORRECTION

PATENT NO. : 5,644,184
DATED : July 1, 1997
INVENTOR(S) : Kucherov

It is certified that error appears in the above-identified patent and that said Letters Patent is hereby corrected as shown below:

Column 10, line 39, delete "$\rho$" and replace with --$p$--.

Column 11, line 14, delete "polarization" and replace with --depolarization--.

Column 20, line 39, delete "0.5" and replace with --0.8--.

Column 22, line 66, delete "$MgO_2$" and replace with --MgO--.

Signed and Sealed this

Tenth Day of March, 1998

*Attest:*

BRUCE LEHMAN

*Attesting Officer*   Commissioner of Patents and Trademarks